(12) United States Patent
Meister et al.

(10) Patent No.: US 12,717,310 B2
(45) Date of Patent: Aug. 25, 2026

(54) SYSTEM AND METHODS FOR PREDICTING PERFORMANCE VARIABLE VALUES OF A GOLF CLUB HEAD

(71) Applicant: Acushnet Company, Fairhaven, MA (US)

(72) Inventors: Jorgen Meister, San Marcos, CA (US); Michael A. Lovato, San Diego, CA (US); Stephanie Luttrell, Carlsbad, CA (US)

(73) Assignee: Acushnet Company, Fairhaven, MA (US)

( * ) Notice: Subject to any disclaimer, the term of this patent is extended or adjusted under 35 U.S.C. 154(b) by 379 days.

(21) Appl. No.: 18/429,866

(22) Filed: Feb. 1, 2024

(65) Prior Publication Data

US 2025/0251717 A1 Aug. 7, 2025

(51) Int. Cl.
*G05B 19/418* (2006.01)
*G06F 30/17* (2020.01)

(52) U.S. Cl.
CPC ......... *G05B 19/4183* (2013.01); *G06F 30/17* (2020.01); *G05B 2219/45173* (2013.01)

(58) Field of Classification Search
CPC ...... G05B 19/4183; G05B 2219/45173; G06F 30/17
See application file for complete search history.

(56) References Cited

U.S. PATENT DOCUMENTS

2020/0023244 A1* 1/2020 Parsons .................... A63B 1/00

FOREIGN PATENT DOCUMENTS

CN 104606858 A * 5/2015

OTHER PUBLICATIONS

Translation of CN 104606858 A. (Year: 2015).*

* cited by examiner

*Primary Examiner* — Jeffrey S Vanderveen
(74) *Attorney, Agent, or Firm* — Mike S. Kim

(57) ABSTRACT

Systems and methods of predicting a performance variable difference during manufacturing are disclosed herein. In accordance with the presently disclosed technology, a method of predicting a performance variable difference during manufacturing may include partially forming a golf club head of a first material, measuring a performance variable of the partially formed golf club head, removing a portion of the partially formed golf club head creating a void, completing a formation of the golf club head by at least filling the void with a second material, and re-measuring the performance variable of the completed golf club head.

21 Claims, 11 Drawing Sheets

SYSTEM AND METHODS FOR PREDICTING PERFORMANCE VARIABLE VALUES OF A GOLF CLUB HEAD

FIELD OF THE DISCLOSURE

The present disclosure generally relates to golf club manufacturing, and more specifically to predicting performance variable values of a golf club head.

SUMMARY

Embodiments of the presently disclosed technology may include systems and methods for predicting a performance variable difference during manufacturing. In accordance with some aspects of the presently disclosed technology, a method of the presently disclosed technology may include a number of operations. One operation may include partially forming a golf club head of a first material. Another operation may include measuring a performance variable of the partially formed golf club head. Yet another operation may include removing a portion of the partially formed golf club head creating a void. Another operation may include completing a formation of the golf club head by at least filling the void with a second material. Yet another operation may include re-measuring the performance variable of the completed golf club head.

In embodiments, another operation may include generating a performance variable value difference, wherein the performance variable value difference is a difference between a re-measured performance variable value of the completed golf club head and a measured performance variable value of the partially formed golf club head.

In embodiments, another operation may include predicting another performance variable value of another completed golf club head by using the performance variable value difference on another partially formed golf club head.

In embodiments, the performance variable value difference may be zero.

In embodiments, the performance variable may be one of a characteristic time, a coefficient of restitution, and a resilience.

In embodiments, the first material may be a metal, and the second material may be a composite.

In accordance with some aspects of the presently disclosed technology, a method of predicting a performance variable value difference during manufacturing is disclosed. The method may include a number of operations. One operation may include measuring a first performance variable on a first workpiece of a golf club head. The first workpiece may include a first portion and a second portion. Another operation may include forming a second workpiece by removing the second portion along a boundary of the first workpiece. Yet another operation may include forming a finished workpiece from the second workpiece by at least coupling a supplemental portion to the first portion along the boundary. Another operation may include re-measuring the first performance variable on the finished workpiece.

In embodiments, another operation may include generating a performance variable value difference, wherein the performance variable value difference is a difference between a re-measured performance variable value of the finished workpiece and a measured performance variable value of the first workpiece.

In embodiments, another operation may include predicting another performance variable value of another finished workpiece by using the performance variable value difference on another first workpiece.

In embodiments, the performance variable may be one of a characteristic time, a coefficient of restitution, and a resilience.

In embodiments, the first material may be a metal, and the second material may be a composite.

In embodiments, the second portion may be removable.

In embodiments, the first portion may be a frontal portion of the golf club head, and the second portion may be a rear portion of the golf club head.

In accordance with some aspects of the presently disclosed technology, a method of manufacturing a completed golf club head is disclosed. The method may include a number of operations. One operation may include forming a first workpiece. The first workpiece may include a first portion and a second portion. The first workpiece may include a first performance variable value. Another operation may include forming a second workpiece by removing the second portion along a boundary of the first workpiece. Yet another operation may include finishing the second workpiece into the finished workpiece by at least coupling a supplemental portion to the first portion along the boundary. The finished workpiece may include a second performance variable value.

In embodiments, a difference between the second performance variable value and the first performance variable value is a performance variable value difference.

In embodiments, the performance variable may be one of a characteristic time, a coefficient of restitution, and a resilience.

In embodiments, the finished workpiece may include multiple, different materials.

In embodiments, the first portion may be a frontal portion of the golf club head, and the second portion may be a rear portion of the golf club head.

In accordance with one aspect of the technology described herein, a system for predicting a performance variable value difference during manufacturing is disclosed. The system may include electronic storage and a physical computer processor configured by machine readable instructions to perform a number of operations. One operation may include measuring a performance variable of a partially formed golf club head. The partially formed golf club head may be formed from a first material. Another operation may include re-measuring the performance variable of a completed golf club head. The completed golf club head may be formed by at least removing a portion of the partially formed golf club head creating a void and filling the void with a second material. Yet another operation may include generating a performance variable value difference. The performance variable value difference may be a difference between a re-measured performance variable value of the completed golf club head and a measured performance variable value of the partially formed golf club head. Another operation may include storing the performance variable value difference.

In embodiments, another operation performed by the machine readable instruction may include predicting another performance variable value of another completed golf club head by using the performance variable value difference on another partially formed golf club head.

In accordance with one aspect of the technology described herein, a system for predicting a performance variable value difference during manufacturing is disclosed. The system may include a physical computer processor configured by machine readable instructions to perform a number of operations. One operation may include using a measuring component configured to measure a performance variable of the partially formed golf club head. The partially formed golf club head may be formed from a first material. Another operation may include using the measuring component configured to re-measure the performance variable of a completed golf club head. The completed golf club head may be formed by at least removing a portion of the partially formed golf club head creating a void and filling the void with a second material. Yet another operation may include using a performance variable and golf club head specification component configured to generate a performance variable value difference. The performance variable value difference may be a difference between a re-measured performance variable value of the completed golf club head and a measured performance variable value of the partially formed golf club head. Another operation may include using a prediction component configured to predict another performance variable value of another completed golf club head by using the performance variable value difference on another partially formed golf club head.

Figure 1:
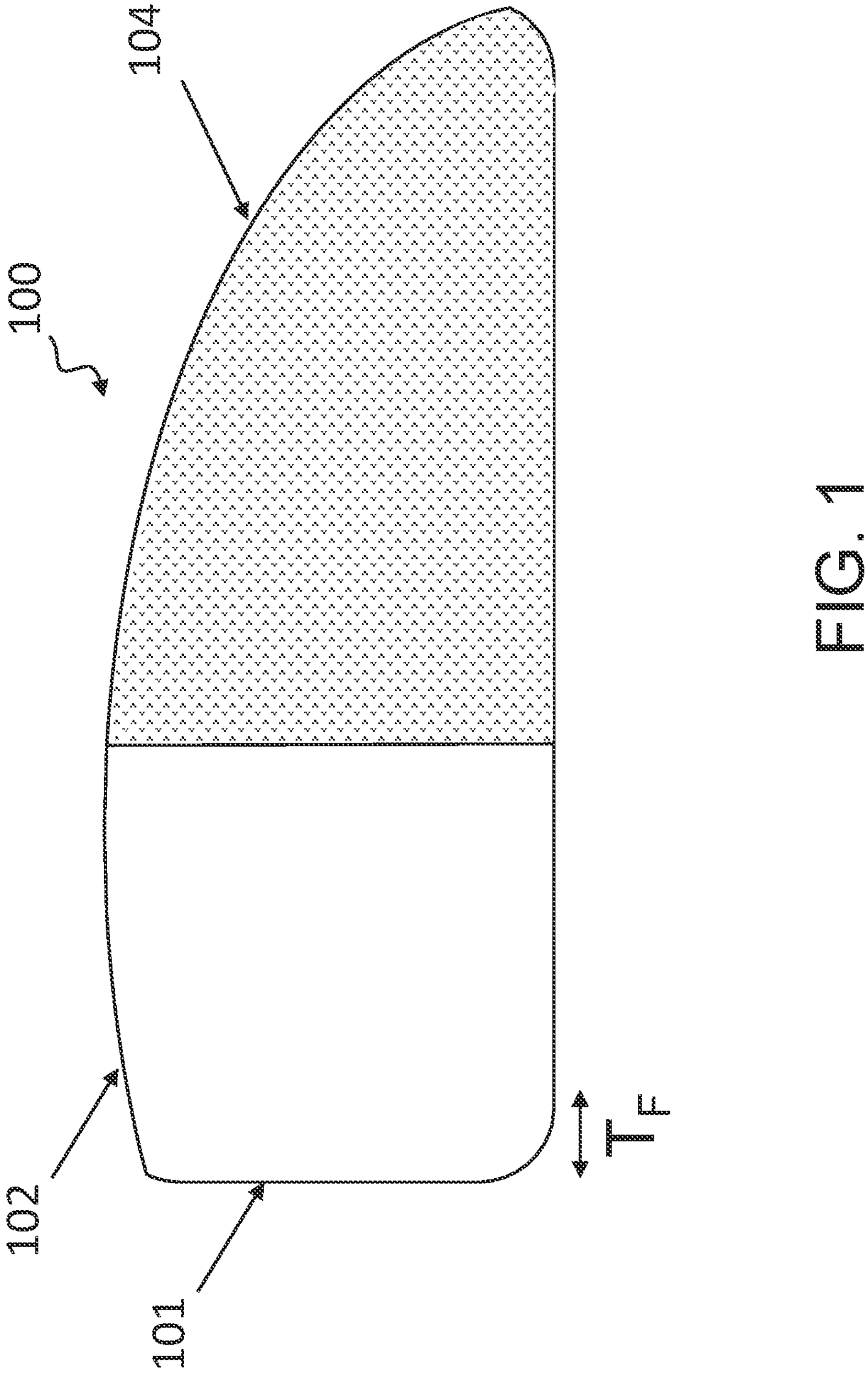
FIG. 1 illustrates a side view of a partially formed golf club head in accordance with one or more embodiments of the presently disclosed technology.

These and other features of the presently disclosed technology, as well as the methods of operation and functions of the related elements of structure and the combination of parts, may be clearer upon consideration of the following detailed description and the claims with reference to these drawings, all of which form a part of this specification, with like reference numerals designating corresponding parts in the various figures. It is to be expressly understood that these drawings are for illustration purposes and description and are not intended to be limiting. It should be noted that for clarity and ease of illustration these drawings are not necessarily made to scale. As used in the specification and in the claims, the singular form of "a", "an", and "the" may include plural referents unless the context clearly dictates otherwise.

DETAILED DESCRIPTION

Manufacturing golf club heads may include multiple steps to form a completed golf club head. Part of this process may include ensuring tolerances for various performance variables and/or golf club head specifications of the completed golf club head are met. Previously, a first workpiece may be created, or it may be understood that the golf club head is partially formed. This workpiece may be polished, welded to, brazed, and/or otherwise modified, including removing portions of the workpiece to complete the formation of the golf club head. The performance variable may be measured at the completed stage which does not reflect the intended performance variable value. Finishing steps may be performed to allow the completed golf club head to have the intended performance variable value. Every time the work piece is made, finishing steps to meet the intended performance variable value may be required that waste time, energy, and money from those involved. There is a need for a process that prevents this unnecessary finishing rework loop to meet the golf club head specifications and the intended performance variable values while maintaining high quality golf club head without any finishing defects.

The presently disclosed technology described herein contemplates manufacturing a golf club head, such as an iron, a fairway wood, a driver, or another type of golf club head to reduce unnecessary finishing rework loops. The presently disclosed technology may allow for consistent manufacturing tolerances. The presently disclosed technology may include systems and methods including partially forming a golf club head, measuring one or more performance variables and/or golf club head specifications, completing a formation of the golf club head, or otherwise finishing the completed golf club head, and re-measuring the one or more performance variables and/or golf club head specifications. A performance variable value difference and/or a golf club head specification value difference may be determined to consistently and repeatably achieve the performance variable value difference and/or a golf club head specification value difference. This may prevent any unnecessary finishing rework loop and maintain multiple high quality golf club heads that did not go through additional finishing steps. This may reduce waste and improve efficiencies in golf club head manufacturing.

Establishing a reference coordinate system for the presently disclosed technology, an x-axis may refer to the axis that is horizontal to the face from a heel to toe direction, a y-axis may refer to the vertical axis through the club in a crown to sole direction, a z-axis may refer to the horizontal axis that is horizontal front to back in a forward and rear direction. Alternatively speaking, the x-axis may be defined as a horizontal axis tangent to a geometric center of the face with the positive direction towards a heel of the golf club head, a y-axis is a vertical axis orthogonal to the x-axis with a positive direction towards a top of the golf club head, and a z-axis being orthogonal to both the x-axis and the y-axis with a positive direction towards a front of the golf club head. The x-y-z coordinate system described above shall be the same for all subsequent discussions. For example, the x-y-z coordinate system may be used to describe the CG of the golf club head. The golf club head may have a CG-x, a CG-y, and a CG-z component corresponding to the x-, y-, and z-coordinates discussed herein.

Figure 2:
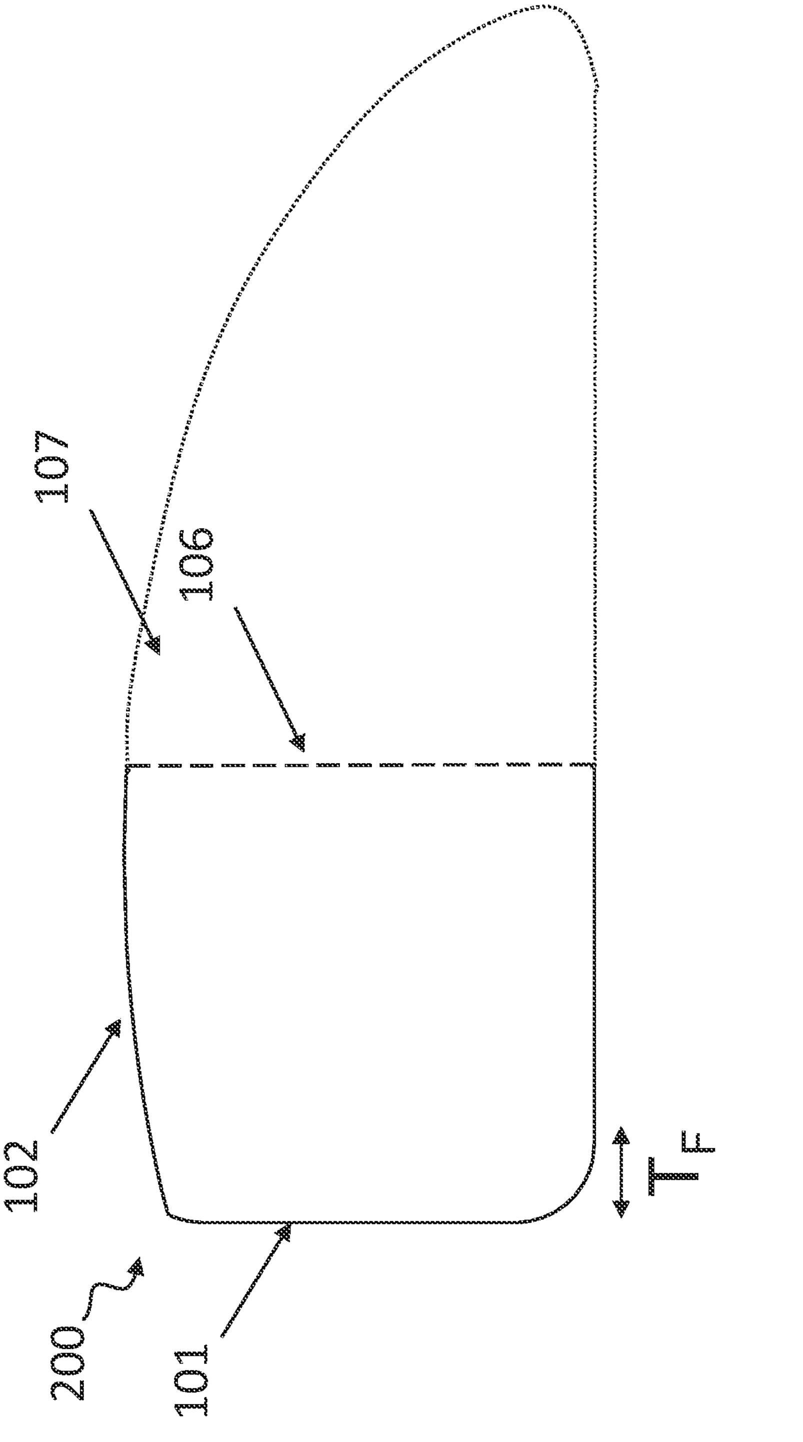
FIG. 2 illustrates a side view of a remaining portion of the partially formed golf club head in accordance with one or more embodiments of the presently disclosed technology.
Figure 3:
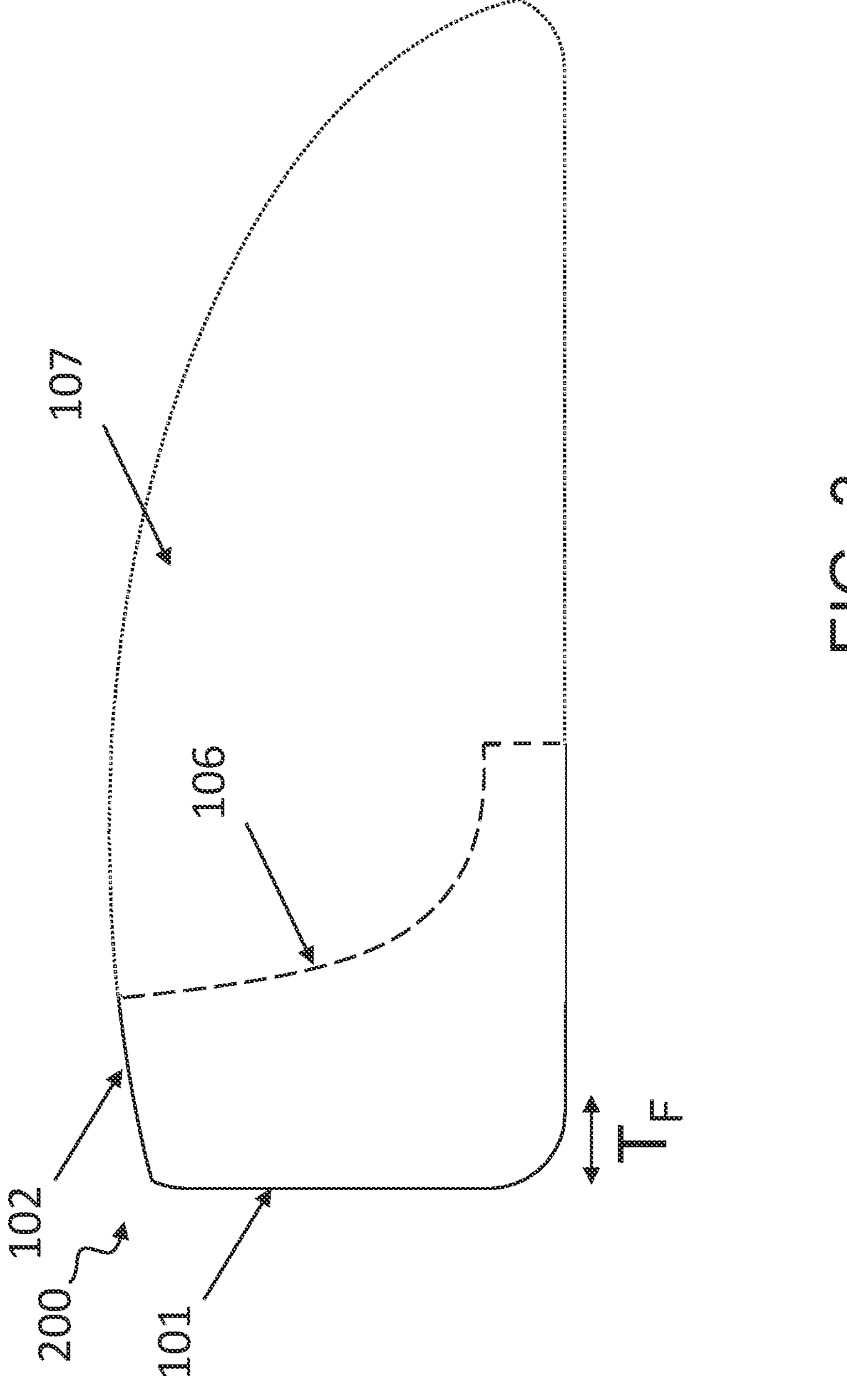
FIG. 3 illustrates a side view of a remaining portion of the partially formed golf club head in accordance with one or more embodiments of the presently disclosed technology.
Figure 4:
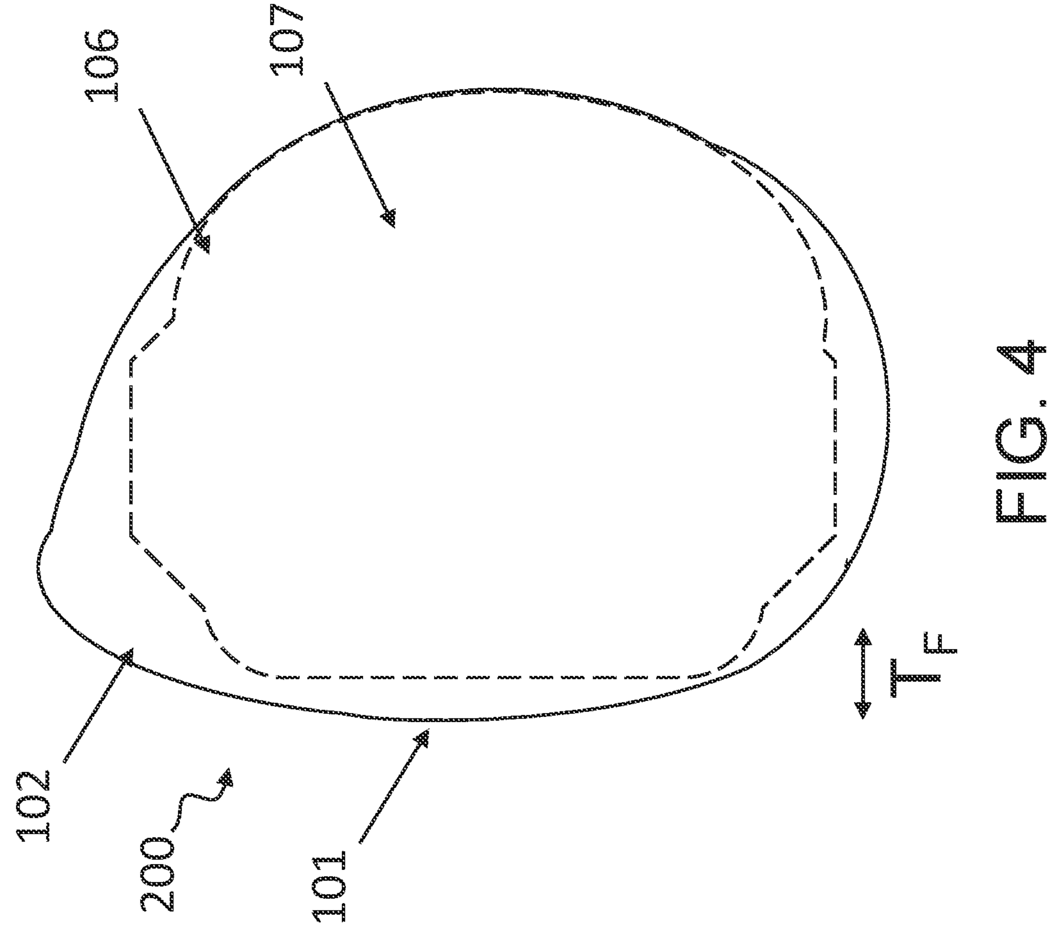
FIG. 4 illustrates a top view of a remaining portion of the partially formed golf club head in accordance with one or more embodiments of the presently disclosed technology.
Figure 5:
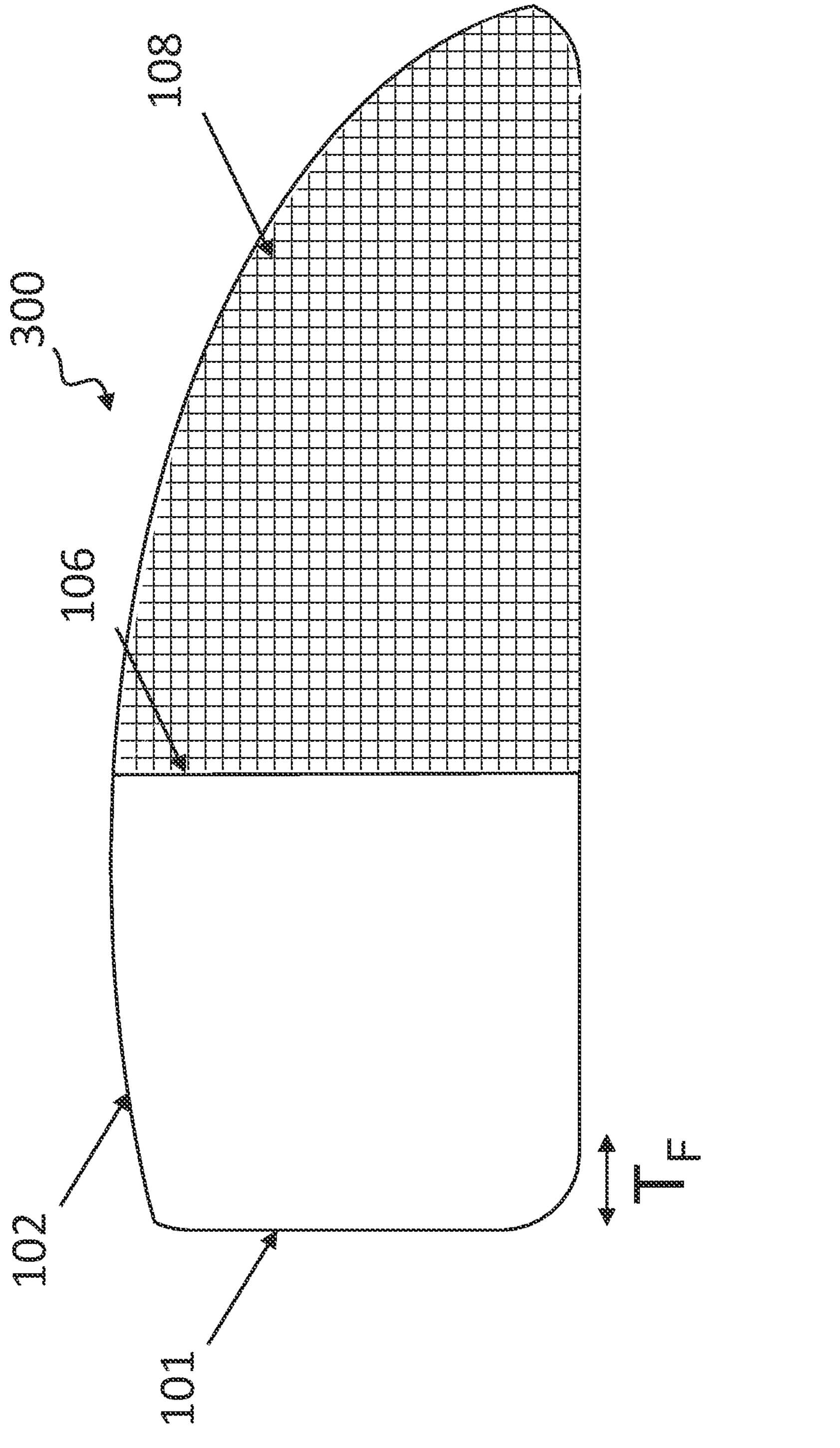
FIG. 5 illustrates a side view of a completed golf club head in accordance with one or more embodiments of the presently disclosed technology.

FIGS. 1-5 illustrate different stages of manufacturing the golf club head in accordance with one or more embodiments of the presently disclosed technology. For example, FIG. 1 illustrates a side view of a partially formed golf club head in accordance with one or more embodiments of the presently disclosed technology. FIG. 2 illustrates a side view of a remaining portion of the partially formed golf club head in accordance with one or more embodiments of the presently disclosed technology. FIG. 3 illustrates a side view of a remaining portion of the partially formed golf club head in accordance with one or more embodiments of the presently disclosed technology. FIG. 4 illustrates a top view of a remaining portion of the partially formed golf club head in accordance with one or more embodiments of the presently disclosed technology. FIG. 5 illustrates a side view of a completed golf club head in accordance with one or more embodiments of the presently disclosed technology.

Referring first to FIG. 1, partially formed golf club head 100 may be an initial golf club head to be finished to form a completed golf club head. In some embodiments, partially formed golf club head 100 may be referred to herein as first workpiece 100. As an example, partially formed golf club head 100 may be a cast metal body with a polished face insert welded to the metal body. The polished face insert may be polished to meet intended performance variables and/or golf club head specifications. In another example, partially formed golf club head 100 may include a cast face cup and a support component on a remaining portion. The face portion may be polished to meet intended performance variables and/or golf club head specifications, though it should be appreciated that different components may be cast, welded, brazed, forged, and/or otherwise manufactured to form partially formed golf club head 100. Partially formed golf club head 100 may be characterized by performance variables and/or golf club head specifications. Performance variables may refer to variables that affect golf club head performance. For example, performance variables may include characteristic time (CT), coefficient of restitution (COR), resilience, center of gravity (CG), moment of inertia (MOI), and/or other performance variables that can affect the flight of a golf ball. In some embodiments, there may be more specific performance variables. For example, CT center, CT hotspot (e.g., the highest CT value on a face of a golf club head), and so on. Golf club head specifications may include weights, materials, shapes, sizes, and/or dimensions of the components of partially formed golf club head 100. For example, this may include total weight, removable weight, integrated weight, face thickness, face height, face material, face weight, face shape, body dimension, body material, and so on. The flight of a golf ball may include fades, draws, launch angles, ball spin, and/or speed.

Partially formed golf club head 100 may include a first material. In some embodiments, partially formed golf club head 100 may include first portion 102 and second portion 104. First portion 102 may include the first material. The first material may be a metal, a plastic, a composite, a fiber, and/or another material without departing from the spirit and scope of the presently disclosed technology. For example, the metal may include aluminum, titanium, steel, and/or other metals without departing from the spirit and scope of the presently disclosed technology. A plastic may include a polyurethane, a urethane, a polycarbonate, a rubber, an aromatic polymer, a plastic, a thermoplastic, a thermoset, a polymer, and/or other plastics. A composite may include fiberglass, carbon fiber, thermoset composites, thermoplastic composites, fibers bonded with resins, and/or other composites. Second portion 104 may include a supplemental material. Second portion 104 may be illustrated with a pattern to indicate the two regions, though it should be appreciated that in some embodiments, the supplemental material may be the same as the first material and the two materials may be indistinguishable from each other. In embodiments, the supplemental material may be different from the first material. The supplemental material may be a composite, a plastic, a fiber, a metal, and/or another material without departing from the spirit and scope of the presently disclosed technology. Second portion 104 may be removable. In some embodiments, second portion 104 may be a support component used to help form first portion 102. In embodiments, if partially formed golf club head 100 is cast, second portion 104 may help with the flow of material to various regions of partially formed golf club head 100 without departing from scope and content of the present invention. The support component may not be intended to be used as a part of the completed golf club head (at least shown as completed golf club head 300 in FIG. 5). As illustrated, first portion 102 may represent a frontal portion, and second portion 104 may represent a rear portion, though it should be appreciated that first portion 102 and second portion 104 may be otherwise located without departing from the spirit and scope of the presently disclosed technology.

Partially formed golf club head 100 may include face 101. As discussed herein, face 101 may include face dimensions. For example, face 101 may include thickness TF. While forming partially formed golf club head 100, face 101 may be polished to arrive at an intended performance variable value and golf club head specification value. In embodiments, face 101 may be polished to have a face thickness TF between about 1.5 mm to about 5.0 mm. For example, face 101 may be polished to about 3.5 mm. This may provide a CT for partially formed golf club head 100 of about 239 microseconds±about 18 microseconds. In some embodiments, the performance variable values and/or golf club head specification values may be generated, provided, and/or determined. Performance variables and golf club head specifications of partially formed golf club head 100 may be measured.

Referring to FIG. 2, a portion of partially formed golf club head 100 may be removed at boundary 106, thereby creating void 107. In some embodiments, partially formed golf club head 100 without the removed portion may be referred to herein as a second workpiece 200. In embodiments, second workpiece 200 may be formed by removing second portion 104 along boundary 106 of first workpiece 100. In some embodiments, boundary 106 may be visually identified on partially formed golf club head 100 to better identify which components will be removed to finish or complete the formation of the completed golf club head (at least shown as completed golf club head 300 in FIG. 5). As an example, a texture, pattern, and/or color may be used along or near boundary 106 to indicate a position of boundary 106. As illustrated from the side view, the removed portion may be a rear portion taken along a vertical cut along boundary 106. Void 107 caused by removing the portion may be illustrated with a dotted line. It should be appreciated that an interior of the frontal portion of partially formed golf club head 100 may be exposed after the rear portion is removed. While illustrated as a linear vertical cut, it should be appreciated that boundary 106 may vary, as illustrated in FIGS. 3 and 4.

Referring to FIG. 3, boundary 106 may be curved or arced. For example, a cut may start at the forward crown area and curve rearward to another point and drop vertically down from there. A direction of removal is described for the purposes of clarity only, and it should be appreciated that the second portion may be otherwise removed (e.g., a different order, at once, and so on) without departing from the spirit and scope of the presently disclosed technology. Referring to FIG. 4, showing a top down view, a straight cut may be made near the face, a curved cut may extend rearward on a heel side, a diagonal cut may be made heelward and rearward, a straight cut may be made rearward, another diagonal cut may be made rearward and toeward, a curved cut may be made toeward along the rear of first portion 102, a diagonal cut may be made faceward and toeward, a straight cut may be made faceward, another diagonal cut may be made heelward and faceward, and a curved cut may extend faceward on the toe side meeting the start of the straight cut. A direction of removal is described for the purposes of clarity only, and it should be appreciated that the second portion may be otherwise removed (e.g., a different order, at once, and so on) without departing from the spirit and scope of the presently disclosed technology. These two examples shown in FIGS. 3 and 4 are merely exemplary to show the potential simplicity and/or complexity of geometries 106 involved in the presently disclosed technology. It should be appreciated that multiple regions may be cut that are not connected to each other. For example, parts of sole may be removed and/or parts of a crown without departing from the spirit and scope of the presently disclosed technology.

Referring to FIG. 5, completed golf club head 300 may be formed by at least filling void 107 with a second material. In some embodiments, completed golf club head 300 may be referred to herein as finished workpiece 300. In embodiments, second workpiece 200 may be finished into the finished workpiece 300 by at least coupling supplemental portion 108 to first portion 102 along boundary 106. Coupling may include bonding, adhering, welding, brazing, and/or other forms of coupling. In some embodiments, forming completed golf club head 300 may include painting, physical vapor deposition coating, and/or otherwise coating finished workpiece 300. In embodiments, these steps may be performed after forming finished workpiece 300.

Performance variables and golf club head specifications of completed golf club head 300 may be re-measured. Re-measuring may include using the same procedure for measuring the partially formed golf club head. As an example, the CT, the CT hotspot, and/or the total weight of completed golf club head 300 may be re-measured. This re-measured value may be compared to the originally measured value of partially formed golf club head 100. The difference between these values may be a performance variable value difference and/or a golf club head specification value difference. The performance variable value difference and/or the golf club head specification value difference may be used on another partially golf club head to predict or determine the final performance variable values and/or the final golf club head specification values of the other completed golf club head. In some embodiments, the performance variable value difference and/or the golf club head specification value difference may be zero. In embodiments, performance variable value difference and/or the golf club head specification value difference may be any value. This value can be used to effectively predict another performance variable value and/or another golf club head specification value for any partially formed golf club head.

Figure 6:
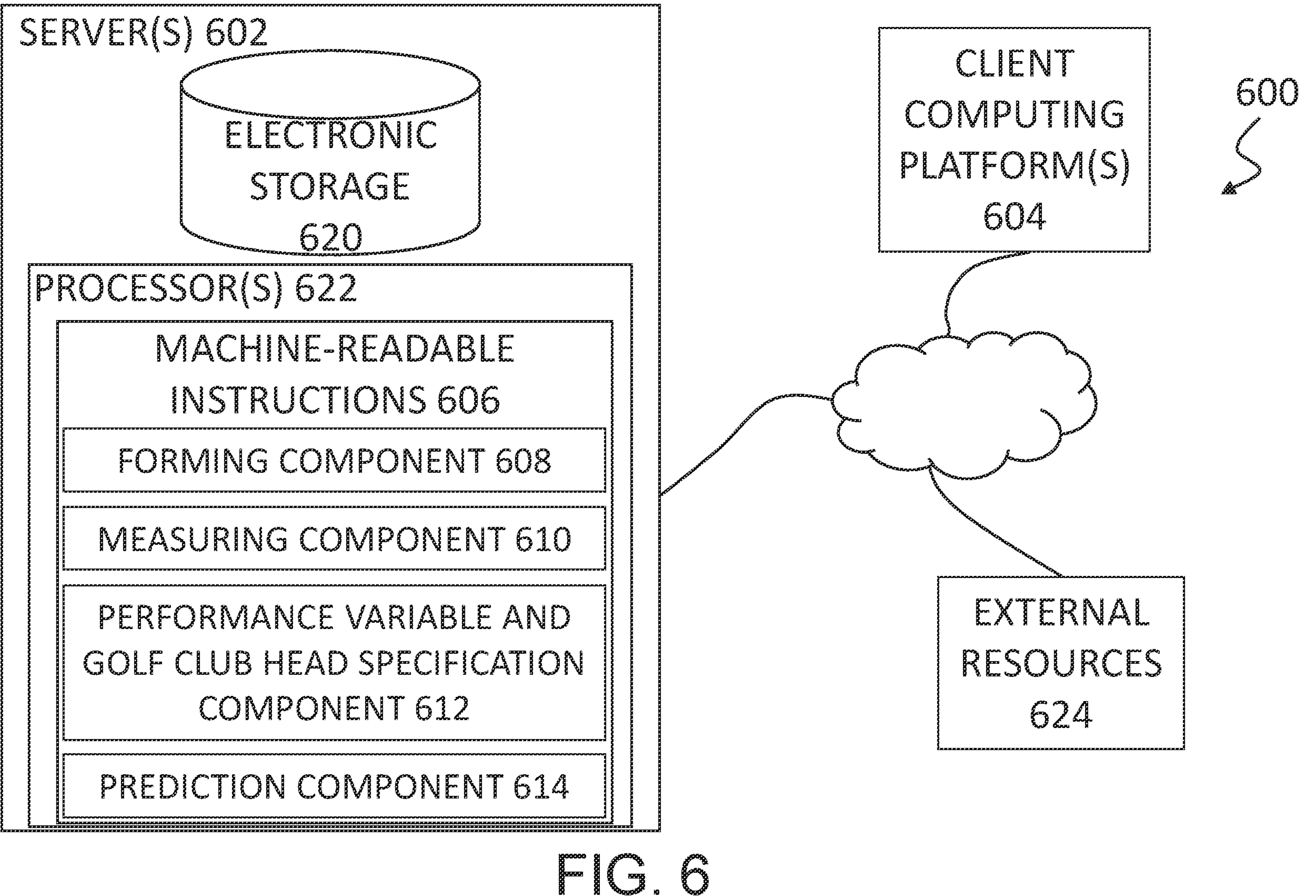
FIG. 6 illustrates a system for predicting a performance variable difference, in accordance with one or more implementations.

FIG. 6 illustrates a system for predicting a performance variable difference, in accordance with one or more embodiments. In some embodiments, system 600 may include a server 602. Server 602 may be configured to communicate with a client computing platform 604 according to a client/server architecture and/or other architectures. Client computing platform 604 may be configured to communicate with other client computing platforms via server 602 and/or according to a peer-to-peer architecture and/or other architectures. Users may access system 600 via client computing platform 604.

Server 602 may be configured by machine-readable instructions 606. Machine-readable instructions 606 may include an instruction component. The instruction component may include computer program components. The instruction component may include a forming component 608, a measuring component 610, a performance variable and golf club head specification component 612, prediction component 614, and/or other instruction components.

Forming component 608 may be configured to partially form a golf club head. The partially formed golf club head may include a first material. For example, a computer-aided manufacturing (CAM) tool may convert a design into a set of instructions for a computer numerical control (CNC) device to form the partially formed golf club head. Any of these devices and/or tools may be configured to communicate with system 600. Forming the partially formed golf club head may include casting, forming, molding, additive manufacturing, welding, brazing, polishing, bonding, adhering, and/or other manufacturing techniques used to form golf club heads. The partially formed golf club head may be formed to intended manufacturing tolerances, including, for example, forming the partially formed golf club head to have a CT of about 239 microseconds±about 18 microseconds, an intended golf club head weight, and/or an intended face thickness.

Measuring component 610 may be configured to measure a performance variable of the partially formed golf club head. This may provide a first performance variable value for the partially formed golf club head. In some embodiments, the first performance variable value may be generated, provided, and/or determined. This may include using a pendulum test device, a CT test device, a COR test device, a CG test device, inertia test device, and/or other tools to measure performance variables. Any of these devices and/or tools may be configured to communicate with system 600. In some embodiments, multiple performance variables may be measured. For example, the pendulum test device may be used to determine the CT center, the CT hotspot, and/or other CT values on the partially formed golf club head.

Measuring component 610 may be configured to measure a golf club head specification of the partially formed golf club head. This may provide a first golf club head specification value for the partially formed golf club head. In some embodiments, the first golf club head specification value may be generated, provided, and/or determined. This may include using dial indicators, calipers, micrometers, air gauges, optical systems, coordinate measuring machines, rulers, scales, ultrasonic thickness gauges, and/or other measuring tools to measure a golf club head specification, as described herein. Any of these tools may be configured to communicate with system 600. For example, micrometers may be used to measure a face thickness. In this example, the face thickness may be measured at a thickest region, a thinnest region, a region corresponding to a CT hotspot, a region corresponding to a CT center, and/or other regions. In another example, the weight of the partially formed golf club head may be measured. In some embodiments, multiple golf club head specifications may be measured.

Referring back to forming component 608, forming component 608 may be configured to remove a portion of the partially formed golf club head. Removing the portion may create a void. As an example, a CNC device may remove the portion. The portion may be visually distinguishable from the remaining portion of the partially formed golf club head at a boundary. For example, the portion may include holes, patterns, textures, may be a different color, or otherwise visually distinguishable.

Forming component 608 may be configured to complete a formation of the golf club head by at least filling the void with a second material. For example, the completed golf club head may be formed by bonding the second material to the first material, thereby filing the void. A CNC device may be used to bond the second material to the first material. The second material may be different form the first material. In some embodiments, the second material may be the same as, or substantially similar to, the first material. It should be appreciated that the void may be filled with multiple materials.

Referring back to measuring component 610, measuring component 610 may be configured to re-measure the performance variable of the completed golf club head. This may provide a second performance variable value for the completed golf club head. In some embodiments, the second performance variable value may be generated, provided, and/or determined. Re-measuring may use the same procedure for measuring the partially formed golf club head. The same performance variable may be re-measured for the completed golf club head using the same procedure for measuring the performance variable of the partially formed golf club head. For example, the pendulum test device may be used to determine the CT center, the CT hotspot, and/or other CT values on the completed golf club head. In some embodiments, multiple performance variables may be re-measured using the same procedure for measuring the partially golf club head, or the first workpiece.

Measuring component 610 may be configured to re-measure the golf club head specification of the completed golf club head. This may provide a second golf club head specification value for the completed golf club head. In some embodiments, the second golf club head specification value may be generated, provided, and/or determined. Re-measuring may use the same procedure for measuring the partially formed golf club head. For example, the face thickness may be re-measured using the same procedure for measuring the face thickness of the partially formed golf club head. In some embodiments, multiple golf club head specifications may be re-measured using the same procedure for measuring the partially formed golf club head.

Performance variable and golf club head specification component 612 may be configured to generate a performance variable value difference. The performance variable value difference may be a difference between a re-measured performance variable value of the completed golf club head and a measured performance variable value of the partially formed golf club head. Alternatively, it may be understood that the performance variable value difference may be the difference between the second performance variable value and the first performance variable value.

Performance variable and golf club head specification component 612 may be configured to generate a golf club head specification value difference. The golf club head specification value difference may be a difference between a re-measured golf club head specification value of the completed golf club head and a measured golf club head specification value of the partially formed golf club head. Alternatively, it may be understood that the golf club head specification value difference may be the difference between the second golf club head specification value and the first golf club head specification value.

Prediction component 614 may be configured to predict another performance variable value of another completed golf club head. The other performance variable value may be predicted by using the performance variable value difference on another partially formed golf club head. For example, a new partially formed golf club head may be formed to the set of intended manufacturing tolerances used for the original partially formed golf club head. A new CT center may be measured on the new partially formed golf club head. The new performance variable value for a new completed golf club head of this new partially formed golf club head may be predicted by applying the performance variable difference to the new performance variable value of the new partially formed golf club head. Alternatively, it may be understood that measuring the new performance variable of the new partially formed golf club head may generate a third performance variable value for the new partially formed golf club head. A fourth performance variable value for a new completed golf club head may be predicted by adding the performance variable value difference to the third performance variable value.

Prediction component 614 may be configured to predict another golf club head specification value of another completed golf club head. The other golf club head specification value may be predicted by using the golf club head specification value difference on another partially formed golf club head. For example, a new partially formed golf club head may be formed to the set of intended manufacturing tolerances used for the original partially formed golf club head. A new CT center may be measured on the new partially formed golf club head. The new golf club head specification value for a new completed golf club head of this new partially formed golf club head may be predicted by applying the golf club head specification difference to the new golf club head specification value of the new partially formed golf club head. Alternatively, it may be understood that measuring the new golf club head specification of the new partially formed golf club head may generate a third golf club head specification value for the new partially formed golf club head. A fourth golf club head specification value for a new completed golf club head may be predicted by adding the golf club head specification value difference to the third golf club head specification value.

In some embodiments, referring back to forming component 608, forming component 608 may be configured to form a first workpiece. The first workpiece may include a first portion and a second portion, as described herein. Forming the first workpiece may be accomplished by the CNC device, as described herein.

In some embodiments, referring back to measuring component 610, measuring component 610 may be configured to measure a performance variable of the first workpiece. This may provide a first performance variable value. In some embodiments, the first performance variable value may be generated, provided, and/or determined. For example, the CT center of the first workpiece may be measured. In some embodiments, multiple performance variables may be measured.

In some embodiments, measuring component 610 may be configured to measure a golf club head specification of the first workpiece. This may provide a first golf club head specification value. In some embodiments, the first golf club head specification value may be generated, provided, and/or determined. For example, the face thickness of the first workpiece may be measured. In some embodiments, multiple golf club head specifications may be measured.

In some embodiments, referring back to forming component 608, forming component 608 may be configured to form a second workpiece. This may be accomplished by removing the second portion along a boundary of the first workpiece. Forming the second workpiece may be accomplished by the CNC device, as described herein.

In some embodiments, referring back to forming component 608, forming component 608 may be configured to form a finished workpiece. The finished workpiece may be formed by at least coupling a supplemental portion to the first portion along the boundary, as described herein. Coupling the supplemental portion may include welding, bonding, adhering, or other coupling techniques. Forming the finished workpiece may be accomplished by the CNC device, as described herein.

In some embodiments, referring back to measuring component 610, measuring component 610 may be configured to re-measure the performance variable of the finished workpiece. This may provide a second performance variable value. In some embodiments, the second performance variable value may be generated, provided, and/or determined. Re-measuring may use the same procedure for measuring the first workpiece. For example, the CT center of the finished workpiece may be measured using the same procedure for measuring the CT center of the first workpiece. In some embodiments, multiple performance variables may be re-measured using the same procedure for measuring the first workpiece.

In some embodiments, measuring component 610 may be configured to re-measure the golf club head specification of the finished workpiece. This may provide a second golf club head specification value. In some embodiments, the second golf club head specification value may be generated, provided, and/or determined. Re-measuring may use the same procedure for measuring the first workpiece. For example, the face thickness may be re-measured using the same procedure for measuring the face thickness of the first workpiece. In some embodiments, multiple golf club head specifications may be measured using the same procedure for measuring the first workpiece.

In some embodiments, referring back to performance variable and golf club head specification component 612, performance variable and golf club head specification component 612 may be configured to generate a performance variable value difference. The performance variable value difference may be a difference between a re-measured performance variable value of the finished workpiece and a measured performance variable value of the first workpiece. Alternatively, it may be understood that the performance variable value difference may be the difference between the second performance variable value and the first performance variable value.

In some embodiments, performance variable and golf club head specification component 612 may be configured to generate a golf club head specification value difference. The golf club head specification value difference may be a difference between a re-measured golf club head specification value of the finished workpiece and a measured golf club head specification value of the first workpiece. Alternatively, it may be understood that the golf club head specification value difference may be the difference between the second golf club head specification value and the first golf club head specification value.

In some embodiments, referring back to prediction component 614 may be configured to predict another performance variable value of another finished workpiece. The other performance variable value may be predicted by using the performance variable value difference on another first workpiece. For example, a new first workpiece may be formed to the set of intended manufacturing tolerances used for the original first workpiece. The CT center may be measured on the new first workpiece. The performance variable value for a new finished workpiece of this new first workpiece may be predicted by applying the performance variable difference to the performance variable value of the new first workpiece. It may be understood that measuring the performance variable of the new first workpiece may generate a third performance variable value for the new first workpiece. A fourth performance variable value for a new finished workpiece may be predicted by adding the performance variable value difference to the third performance variable value.

Prediction component 614 may be configured to predict another golf club head specification value of another finished workpiece. The other golf club head specification value may be predicted by using the golf club head specification value difference on another first workpiece. For example, a new first workpiece may be formed to a set of intended manufacturing tolerances. The CT center may be measured on the new first workpiece. The golf club head specification value for a new finished workpiece of this new first workpiece may be predicted by applying the golf club head specification difference to the golf club head specification value of the new first workpiece. It may be understood that measuring the golf club head specification of the new first workpiece may generate a third golf club head specification value for the new first workpiece. A fourth golf club head specification value for a new finished workpiece may be predicted by adding the golf club head specification value difference to the third golf club head specification value.

In some embodiments, server 602, client computing platform 604, and/or external resources 624 may be operatively linked via an electronic communication link. For example, such electronic communication link may be established, at least in part, via a network such as the Internet, a local or wide area network, and/or other networks. In some embodiments, a communications interface may be used, which may include a modem or softmodem, a network interface (such as an Ethernet, network interface card, WiMedia, or other interface), a communications port (such as for example, a USB port, IR port, RS232 port Bluetooth® interface, or other port), or other communications interface. Software and data transferred via the communications interface may typically be carried on signals, which may be electronic, electromagnetic (which includes optical) or other signals capable of being exchanged by a given communications interface. These signals may be provided to/from the communications interface via a channel. The channel may carry signals and may be implemented using a wired or wireless communication medium. Some non-limiting examples of the channel include a phone line, a cellular or other radio link, a RF link, an optical link, a network interface, a local or wide area network, and other wired or wireless communications channels. It will be appreciated that this is not intended to be limiting, and that the scope of this disclosure includes embodiments, in which server 602, client computing platform 604, and/or external resources 624 may be operatively linked via some other communication media.

A given client computing platform 604 may include a processor to execute computer program components. The computer program components may enable a user corresponding to the given client computing platform 604 to interface with system 600 and/or external resources 624, and/or provide other functionality attributed herein to client computing platform 604. By way of non-limiting example, the given client computing platform 604 may include a desktop computer, a laptop computer, a handheld computer, a tablet computer, a smartphone, a gaming console, and/or other computing platforms.

External resources 624 may include sources of information outside of system 600, external entities participating with system 600, and/or other resources. In some embodiments, some or all of the functionality attributed herein to external resources 624 may be provided by resources included in system 600.

Server 602 may include electronic storage 620, processor 622, and/or other components. Server 602 may include communication lines, or ports, to enable the exchange of information with a network and/or other computing platforms. Illustration of server 602 in FIG. 6 is not intended to be limiting. Server 602 may include a plurality of hardware, software, and/or firmware components operating together to provide the functionality attributed herein to server 602. For example, server 602 may be implemented by a cloud of computing platforms operating together as server 602.

Electronic storage 620 may include storage media that electronically store information. The electronic storage media of electronic storage 620 may include one or both of system storage that is provided integrally (i.e., substantially non-removable) with server 602 and/or removable storage that is removably connectable to server 602 via, for example, a port (e.g., a USB port, a firewire port, and/or other ports) or a drive (e.g., a disk drive and/or other drives). Electronic storage 620 may include non-transitory storage media, non-transient electronic storage, optically readable storage media (e.g., optical disks and/or other optically readable storage media), magnetically readable storage media (e.g., magnetic tape, magnetic hard drive, and/or other magnetically readable storage media), electrical charge-based storage media (e.g., EEPROM, RAM, and/or other electrical charge-based storage media), solid-state storage media (e.g., flash drive and/or other solid-state storage media), and/or other electronically readable storage media. Electronic storage 620 may include a virtual storage resource (e.g., cloud storage, a virtual private network, and/or other virtual storage resources). Electronic storage 620 may store software algorithms, information determined by processor 622, information received from server 602, information received from client computing platform 604, and/or other information that enables server 602 to function as described herein. It should be appreciated that the information may be stored in its natural and/or raw format (e.g., data lakes).

Processor 622 may provide information processing capabilities in server 602. As such, processor 622 may include a physical computer processor, a digital processor, an analog processor, a digital circuit designed to process information, an analog circuit designed to process information, a state machine, and/or other mechanisms for electronically processing information. Processor 622 may be implemented using a special-purpose processing component such as, for example, a microprocessor, controller, or other control logic. Although processor 622 is shown in FIG. 6 as a single entity, this is for illustrative purposes only. In some embodiments, processor 622 may include a plurality of processing units. These processing units may be physically located within the same device, or processor 622 may represent processing functionality of a plurality of devices operating in coordination. Processor 622 may execute components 608, 610, 612, 614, and/or other components. Processor 622 may execute components 608, 610, 612, 614, and/or other components by software; hardware; firmware; some combination of software, hardware, and/or firmware; and/or other mechanisms for configuring processing capabilities on processor 622. Processor 622 may be connected to a bus by way of circuitry, although any communication medium may be used to facilitate interaction with other components of or to communicate externally. As used herein, the term "component" may refer to any component or set of components that perform the functionality attributed to the component. This may include a physical processor during execution of processor readable instructions, the processor readable instructions, circuitry, hardware, storage media, or any other components.

It should be appreciated that although components 608, 610, 612, and 614 are illustrated in FIG. 6 as being implemented within a single processing unit, in embodiments, in which processor 622 includes multiple processing units, one of components 608, 610, 612, and/or 614 may be implemented remotely from the other components. The description of the functionality provided by the different components 608, 610, 612, and/or 614 described below is for illustrative purposes, and is not intended to be limiting, as any of components 608, 610, 612, and/or 614 may provide more or less functionality than is described. For example, one of components 608, 610, 612, and/or 614 may be eliminated, and some or all of its functionality may be provided by other ones of components 608, 610, 612, and/or 614. As an example, processor 622 may execute an additional component that may perform some or all of the functionality attributed below to components 608, 610, 612, and/or 614.

Figure 7:
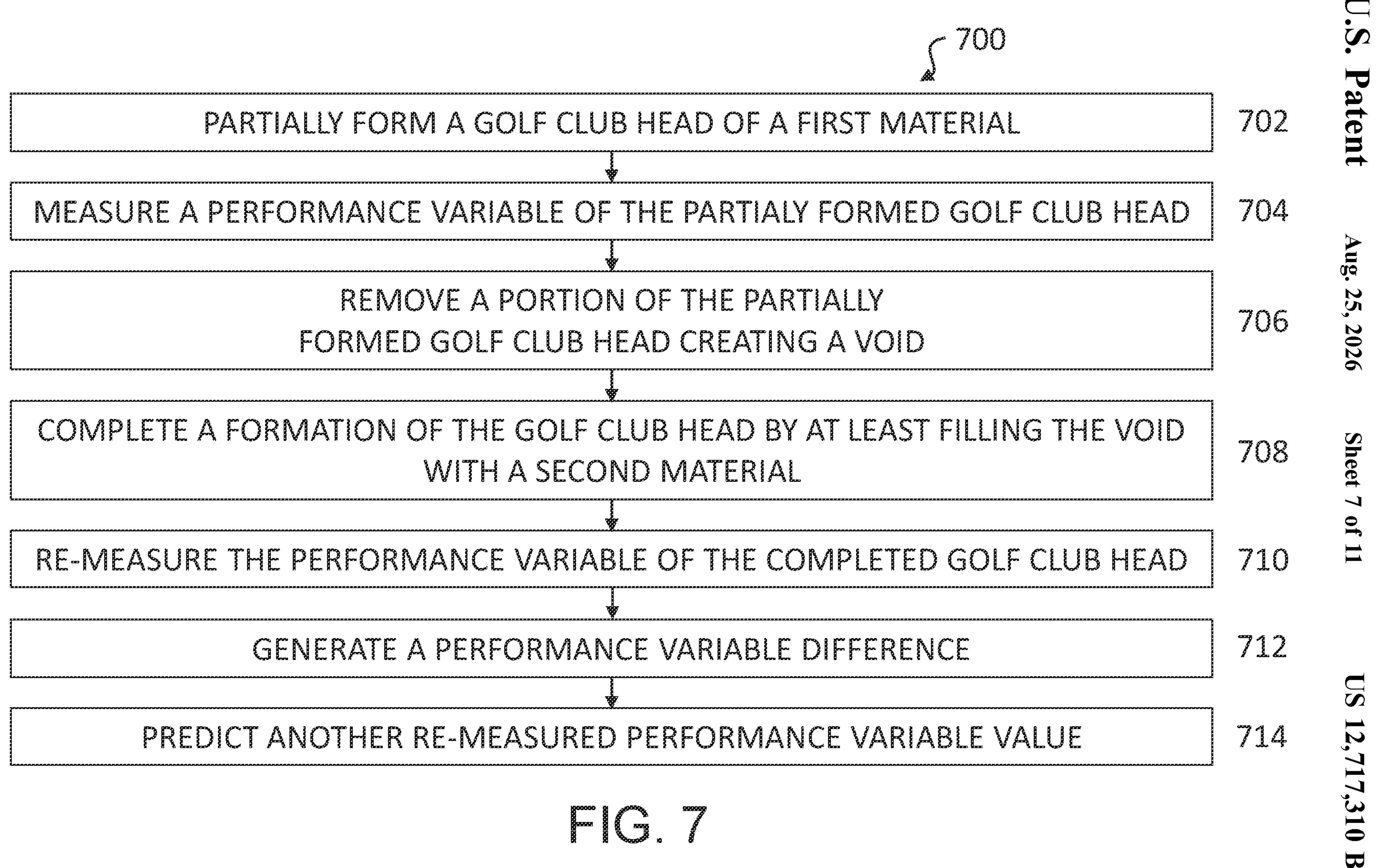
FIG. 7 illustrates an example flow diagram for predicting a performance variable difference during manufacturing in accordance with one or more embodiments of the present disclosure.

FIG. 7 illustrates an example flow diagram 700 for predicting a performance variable difference during manufacturing in accordance with one or more embodiments of the present disclosure. The operations of flow diagram 700, 800, 900, 1000, and 1100 presented below are intended to be illustrative. In some embodiments, flow diagrams 700, 800, 900, 1000, and 1100 may be accomplished with additional operations not described and/or without one of the operations discussed. Additionally, the order in which the operations of methods 700, 800, 900, 1000, and 1100 are illustrated in FIGS. 7, 8, 9, 10, and 11 and described below are not intended to be limiting.

In some embodiments, at least some operations of methods 700, 800, 900, 1000, and 1100 may be implemented in a processing device (e.g., a physical computer processor, a digital processor, an analog processor, a digital circuit designed to process information, an analog circuit designed to process information, a state machine, and/or other mechanisms for electronically processing information). The processing device may include a device executing some or all of the operations of methods 700, 800, 900, 1000, and 1100 in response to instructions stored electronically on an electronic storage medium. The processing device may include a device configured through hardware, firmware, and/or software to be specifically designed for execution of operations of methods 700, 800, 900, 1000, and 1100.

702 may include partially forming a golf club head of a first material. Partially forming may include casting a component of the golf club head and polishing and/or otherwise finishing the partially formed golf club head to the intended performance variable values and intended golf club head specification values. 702 may be performed by a physical computer processor configured by machine-readable instructions including a component that is the same as or similar to forming component 608, in accordance with one or more embodiments. This may include a physical computer processor developed to cast, forge, weld, bond, mold, remove, or otherwise form the partially formed golf club head. For example, this may include using a CNC device, as discussed herein. In embodiments, 702 may be fully or partially performed by hand or without computer and/or automated aid.

704 may include measuring the performance variable of the partially formed golf club head. The measured performance variable value of the partially formed golf club head may be recorded or otherwise stored in electronic storage. 704 may be performed by a physical computer processor configured by machine-readable instructions including a component that is the same as or similar to measuring component 610, in accordance with one or more embodiments. For example, this may include measuring a CT center using a CT test device. In embodiments, 704 may be fully or partially performed by hand or without computer and/or automated aid.

In some embodiments, method 700 may include measuring a golf club head specification of the partially formed golf club head. The measured golf club head specification value of the partially formed golf club head may be recorded or otherwise stored in electronic storage. This operation may be performed by a physical computer processor configured by machine-readable instructions including a component that is the same as or similar to measuring component 610, in accordance with one or more embodiments. For example, this may include measuring a face thickness TF using a micrometer. In some embodiments, this may also include measuring a total club weight. In embodiments, this operation may be fully or partially performed by hand or without computer and/or automated aid.

706 may include removing a portion of the partially formed golf club head creating a void. 706 may be performed by a physical computer processor configured by machine-readable instructions including a component that is the same as or similar to forming component 608, in accordance with one or more embodiments. This may include a physical computer processor developed to cast, forge, weld, bond, mold, remove, or otherwise form the golf club head. For example, this may include using a CNC device, as discussed herein. In embodiments, 706 may be fully or partially performed by hand or without computer and/or automated aid.

708 may include completing a formation of the golf club head by at least filling the void with a second material. 708 may be performed by a physical computer processor configured by machine-readable instructions including a component that is the same as or similar to forming component 608, in accordance with one or more embodiments. This may include a physical computer processor developed to cast, forge, weld, bond, mold, remove, or otherwise form the golf club head. For example, this may include using a CNC device, as discussed herein. In embodiments, 708 may be fully or partially performed by hand or without computer and/or automated aid.

710 may include re-measuring the performance variable of the completed golf club head. The re-measured performance variable value of the completed golf club head may be recorded or otherwise stored. 710 may be performed by a physical computer processor configured by machine-readable instructions including a component that is the same as or similar to measuring component 610, in accordance with one or more embodiments. For example, this may include measuring a CT center using a CT test device. In embodiments, 710 may be fully or partially performed by hand or without computer and/or automated aid.

In some embodiments, method 700 may include re-measuring the golf club head specification of the completed golf club head. The measured golf club head specification value of the completed golf club head may be recorded or otherwise stored in electronic storage. This operation may be performed by a physical computer processor configured by machine-readable instructions including a component that is the same as or similar to measuring component 610, in accordance with one or more embodiments. For example, this may include measuring a face thickness TF using a micrometer. In some embodiments, this may also include measuring a total club weight. In embodiments, this operation may be fully or partially performed by hand or without computer and/or automated aid.

712 may include generating a performance variable value difference may be a difference between a re-measured performance variable value of the completed golf club head and a measured performance variable value of the partially formed golf club head. The performance variable value difference may be recorded or otherwise stored. 712 may be performed by a physical computer processor configured by machine-readable instructions including a component that is the same as or similar to performance variable and golf club head specification component 612, in accordance with one or more embodiments. In embodiments, 710 may be fully or partially performed by hand or without computer and/or automated aid.

In some embodiments, method 700 may include generating a golf club head specification value difference. The golf club head specification value difference may be a difference between a re-measured golf club head specification value of the completed golf club head and a measured golf club head specification value of the partially formed golf club head. The golf club head specification value difference may be recorded or otherwise stored in electronic storage. This operation may be performed by a physical computer processor configured by machine-readable instructions including a component that is the same as or similar to performance variable and golf club head specification component 612, in accordance with one or more embodiments. In embodiments, this operation may be fully or partially performed by hand or without computer and/or automated aid.

714 may include predicting another re-measured performance variable value of another completed golf club head by using the performance variable value difference on another partially formed golf club head. A new performance variable value for a new partially formed golf club head may be generated, provided, and/or determined. By applying the performance variable value difference to a new performance variable value of the new partially formed golf club head, a new re-measured performance variable value of a new completed golf club head corresponding to the new partially formed golf club head may be predicted. The predicted golf club head specification value of the new completed golf club head may be recorded or otherwise stored in electronic storage. 714 may be performed by a physical computer processor configured by machine-readable instructions including a component that is the same as or similar to prediction component 614, in accordance with one or more embodiments. In embodiments, 714 may be fully or partially performed by hand or without computer and/or automated aid.

Figure 8:
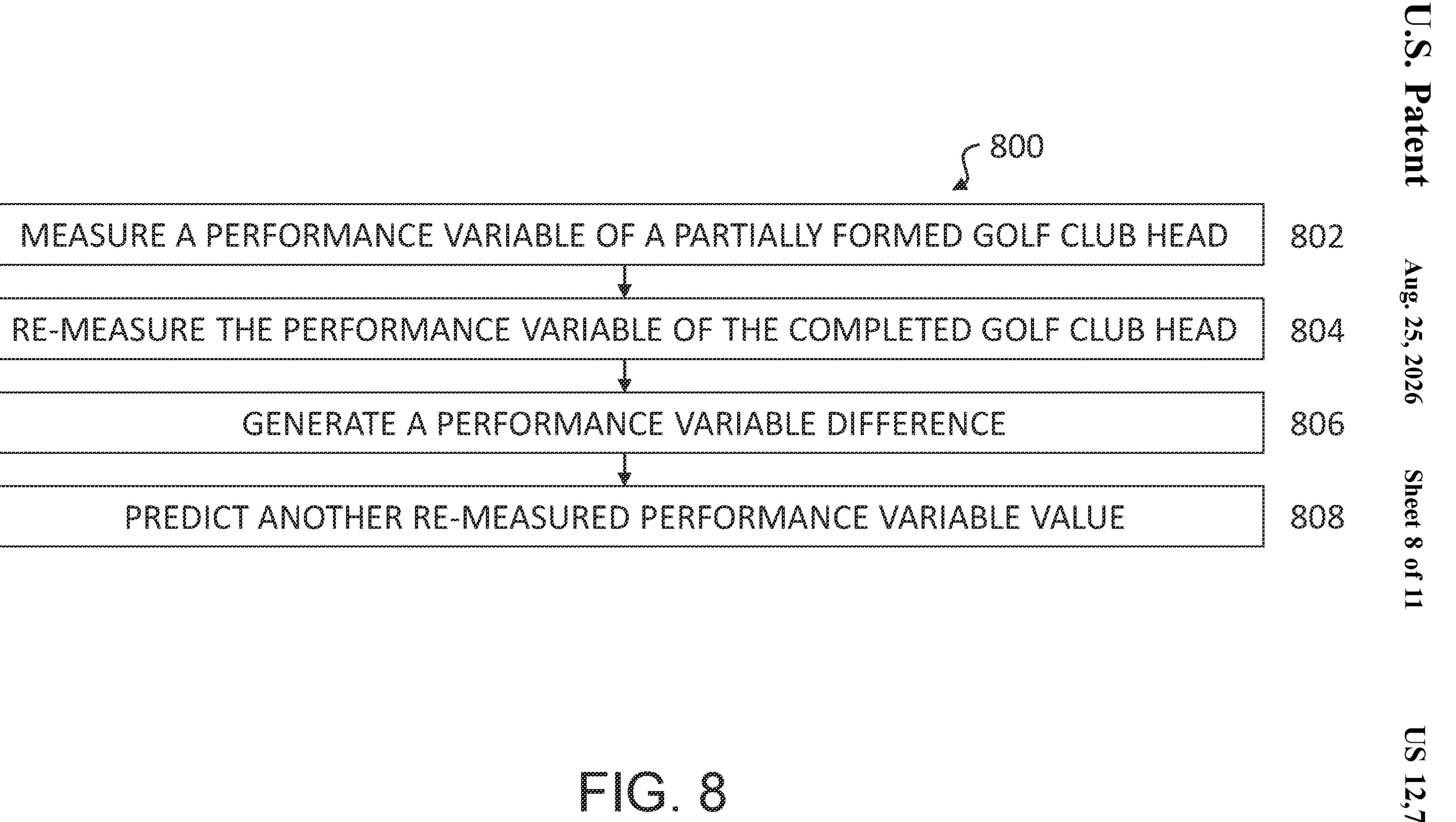
FIG. 8 illustrates an example flow diagram for predicting a performance variable difference during manufacturing in accordance with one or more embodiments of the present disclosure.

FIG. 8 illustrates an example flow diagram 800 for predicting a performance variable difference during manufacturing in accordance with one or more embodiments of the present disclosure. 802 may include measuring a performance variable of a partially formed golf club head. The partially formed golf club head may be formed from a first material. The partially formed golf club head may be formed by casting a component of the golf club head and polishing and/or otherwise finishing the first workpiece to the intended performance variable values and intended golf club head specification values. The measured performance variable value of the partially formed golf club head may be recorded or otherwise stored in electronic storage. 802 may be performed by a physical computer processor configured by machine-readable instructions including a component that is the same as or similar to measuring component 610, in accordance with one or more embodiments. For example, this may include measuring a CT center using a CT test device. In embodiments, 802 may be fully or partially performed by hand or without computer and/or automated aid.

In some embodiments, method 800 may include measuring a golf club head specification of the partially formed golf club head. The measured golf club head specification value of the partially formed golf club head may be recorded or otherwise stored in electronic storage. This operation may be performed by a physical computer processor configured by machine-readable instructions including a component that is the same as or similar to measuring component 610, in accordance with one or more embodiments. For example, this may include measuring a face thickness TF using a micrometer. In some embodiments, this may also include measuring a total club weight. In embodiments, this operation may be fully or partially performed by hand or without computer and/or automated aid.

804 may include re-measuring the performance variable of the completed golf club head. The re-measured performance variable value of the completed golf club head may be recorded or otherwise stored. 804 may be performed by a physical computer processor configured by machine-readable instructions including a component that is the same as or similar to measuring component 610, in accordance with one or more embodiments. For example, this may include measuring a CT center using a CT test device. The completed golf club head may be formed by at least removing a portion of the partially formed golf club head creating a void. The completed golf club head may be formed by at least forming a completed golf club head by at least filling the void with a second material. These formation steps may be performed by a physical computer processor configured by machine-readable instructions including a component that is the same as or similar to forming component 608, in accordance with one or more embodiments. This may include a physical computer processor developed to cast, forge, weld, bond, mold, remove, or otherwise form the golf club head. For example, this may include using a CNC device, as discussed herein. In embodiments, 804 may be fully or partially performed by hand or without computer and/or automated aid.

In some embodiments, method 800 may include re-measuring the golf club head specification of the completed golf club head. The completed golf club head may be formed as described herein. The measured golf club head specification value of the completed golf club head may be recorded or otherwise stored in electronic storage. This operation may be performed by a physical computer processor configured by machine-readable instructions including a component that is the same as or similar to measuring component 610, in accordance with one or more embodiments. For example, this may include measuring a face thickness TF using a micrometer. In some embodiments, this may also include measuring a total club weight. In embodiments, this operation may be fully or partially performed by hand or without computer and/or automated aid.

806 may include generating a performance variable value difference may be a difference between a re-measured performance variable value of the completed golf club head and a measured performance variable value of the partially formed golf club head. The performance variable value difference may be recorded or otherwise stored. 808 may be performed by a physical computer processor configured by machine-readable instructions including a component that is the same as or similar to performance variable and golf club head specification component 612, in accordance with one or more embodiments. In embodiments, 806 may be fully or partially performed by hand or without computer and/or automated aid.

In some embodiments, method 800 may include generating a golf club head specification value difference. The golf club head specification value difference may be a difference between a re-measured golf club head specification value of the completed golf club head and a measured golf club head specification value of the partially formed golf club head. The golf club head specification value difference may be recorded or otherwise stored in electronic storage. This operation may be performed by a physical computer processor configured by machine-readable instructions including a component that is the same as or similar to performance variable and golf club head specification component 612, in accordance with one or more embodiments. In embodiments, this operation may be fully or partially performed by hand or without computer and/or automated aid.

808 may include predicting another re-measured performance variable value of another completed golf club head by using the performance variable value difference on another partially formed golf club head. A new performance variable value for a new partially formed golf club head may be generated, provided, and/or determined. By applying the performance variable value difference to a new performance variable value of the new partially formed golf club head, a new re-measured performance variable value of a new completed golf club head corresponding to the new partially formed golf club head may be predicted. The predicted golf club head specification value of the new completed golf club head may be recorded or otherwise stored in electronic storage. 808 may be performed by a physical computer processor configured by machine-readable instructions including a component that is the same as or similar to prediction component 614, in accordance with one or more embodiments. In embodiments, 808 may be fully or partially performed by hand or without computer and/or automated aid.

Figure 9:
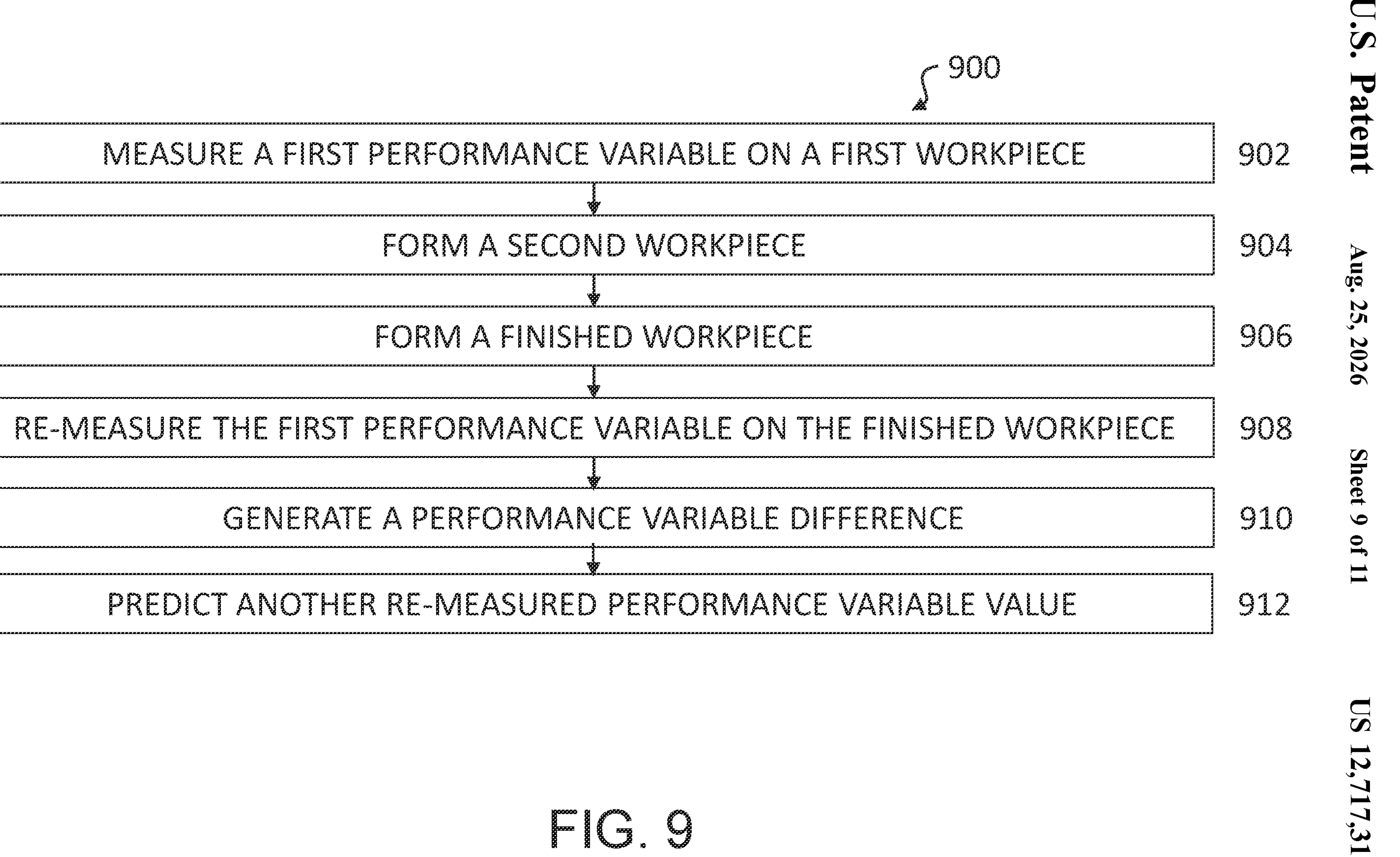
FIG. 9 illustrates an example flow diagram for predicting a performance variable difference during manufacturing in accordance with one or more embodiments of the presently disclosed technology.

FIG. 9 illustrates an example flow diagram 900 for predicting a performance variable difference during manufacturing in accordance with one or more embodiments of the present disclosure. 902 may include measuring a first performance variable on a first workpiece of a golf club head. The first workpiece may include a first portion and a second portion. The first workpiece may be formed by casting a component of the golf club head and polishing and/or otherwise finishing the first workpiece to the intended performance variable values and intended golf club head specification values. The measured performance variable value of the first workpiece may be recorded or otherwise stored in electronic storage. In some embodiments, the measured performance variable value may be referred to as a first performance variable value. 902 may be performed by a physical computer processor configured by machine-readable instructions including a component that is the same as or similar to measuring component 610, in accordance with one or more embodiments. For example, this may include measuring a CT center using a CT test device. In embodiments, 902 may be fully or partially performed by hand or without computer and/or automated aid.

In some embodiments, method 900 may include measuring a golf club head specification of the first workpiece. The measured golf club head specification value of the first workpiece may be recorded or otherwise stored in electronic storage. This operation may be performed by a physical computer processor configured by machine-readable instructions including a component that is the same as or similar to measuring component 610, in accordance with one or more embodiments. For example, this may include measuring a face thickness TF using a micrometer. In some embodiments, this may also include measuring a total club weight. In embodiments, this operation may be fully or partially performed by hand or without computer and/or automated aid.

904 may include forming a second workpiece. The second workpiece may be formed by at least removing the second portion along a boundary of the first workpiece. 904 may be performed by a physical computer processor configured by machine-readable instructions including a component that is the same as or similar to forming component 608, in accordance with one or more embodiments. This may include a physical computer processor developed to cast, forge, weld, bond, mold, remove, or otherwise form the golf club head. For example, this may include using a CNC device, as discussed herein. In embodiments, 904 may be fully or partially performed by hand or without computer and/or automated aid.

906 may include forming a finished workpiece. The finished workpiece may be formed from the second workpiece. This may include coupling a supplemental portion to the first portion along the boundary. 906 may be performed by a physical computer processor configured by machine-readable instructions including a component that is the same as or similar to forming component 608, in accordance with one or more embodiments. This may include a physical computer processor developed to cast, forge, weld, bond, mold, remove, or otherwise form the golf club head. For example, this may include using a CNC device, as discussed herein. In embodiments, 906 may be fully or partially performed by hand or without computer and/or automated aid.

908 may include re-measuring the first performance variable on the finished workpiece. The re-measured performance variable value of the finished workpiece may be recorded or otherwise stored. In some embodiments, the re-measured performance variable value may be referred to as a second performance variable value. 908 may be performed by a physical computer processor configured by machine-readable instructions including a component that is the same as or similar to measuring component 610, in accordance with one or more embodiments. For example, this may include measuring a CT center using a CT test device. In embodiments, 908 may be fully or partially performed by hand or without computer and/or automated aid.

In some embodiments, method 900 may include re-measuring the golf club head specification of the finished workpiece. The measured golf club head specification value of the finished workpiece may be recorded or otherwise stored in electronic storage. This operation may be performed by a physical computer processor configured by machine-readable instructions including a component that is the same as or similar to measuring component 610, in accordance with one or more embodiments. For example, this may include measuring a face thickness TF using a micrometer. In some embodiments, this may also include measuring a total club weight. In embodiments, this operation may be fully or partially performed by hand or without computer and/or automated aid.

910 may include generating a performance variable value difference. The performance variable value difference may be a difference between a re-measured performance variable value of the completed golf club head and a measured performance variable value of the partially formed golf club head. The performance variable value difference may be recorded or otherwise stored. In some embodiments, the performance variable value difference may be a difference between the second performance variable value and the first performance variable value. 910 may be performed by a physical computer processor configured by machine-readable instructions including a component that is the same as or similar to performance variable and golf club head specification component 612, in accordance with one or more embodiments. In embodiments, 910 may be fully or partially performed by hand or without computer and/or automated aid.

In some embodiments, method 900 may include generating a golf club head specification value difference. The golf club head specification value difference may be a difference between a re-measured golf club head specification value of the finished workpiece and a measured golf club head specification value of the first workpiece. The golf club head specification value difference may be recorded or otherwise stored in electronic storage. This operation may be performed by a physical computer processor configured by machine-readable instructions including a component that is the same as or similar to performance variable and golf club head specification component 612, in accordance with one or more embodiments. In embodiments, this operation may be fully or partially performed by hand or without computer and/or automated aid.

912 may include predicting another re-measured performance variable value of another finished workpiece by using the performance variable value difference on another first workpiece. A new performance variable value for a new first workpiece may be generated, provided, and/or determined. By applying the performance variable value difference to a new performance variable value of the new first workpiece, a new re-measured performance variable value of a new finished workpiece corresponding to the new first workpiece may be predicted. The predicted golf club head specification value of the new finished workpiece may be recorded or otherwise stored in electronic storage. 912 may be performed by a physical computer processor configured by machine-readable instructions including a component that is the same as or similar to prediction component 614, in accordance with one or more embodiments. In embodiments, 912 may be fully or partially performed by hand or without computer and/or automated aid.

Figure 10:
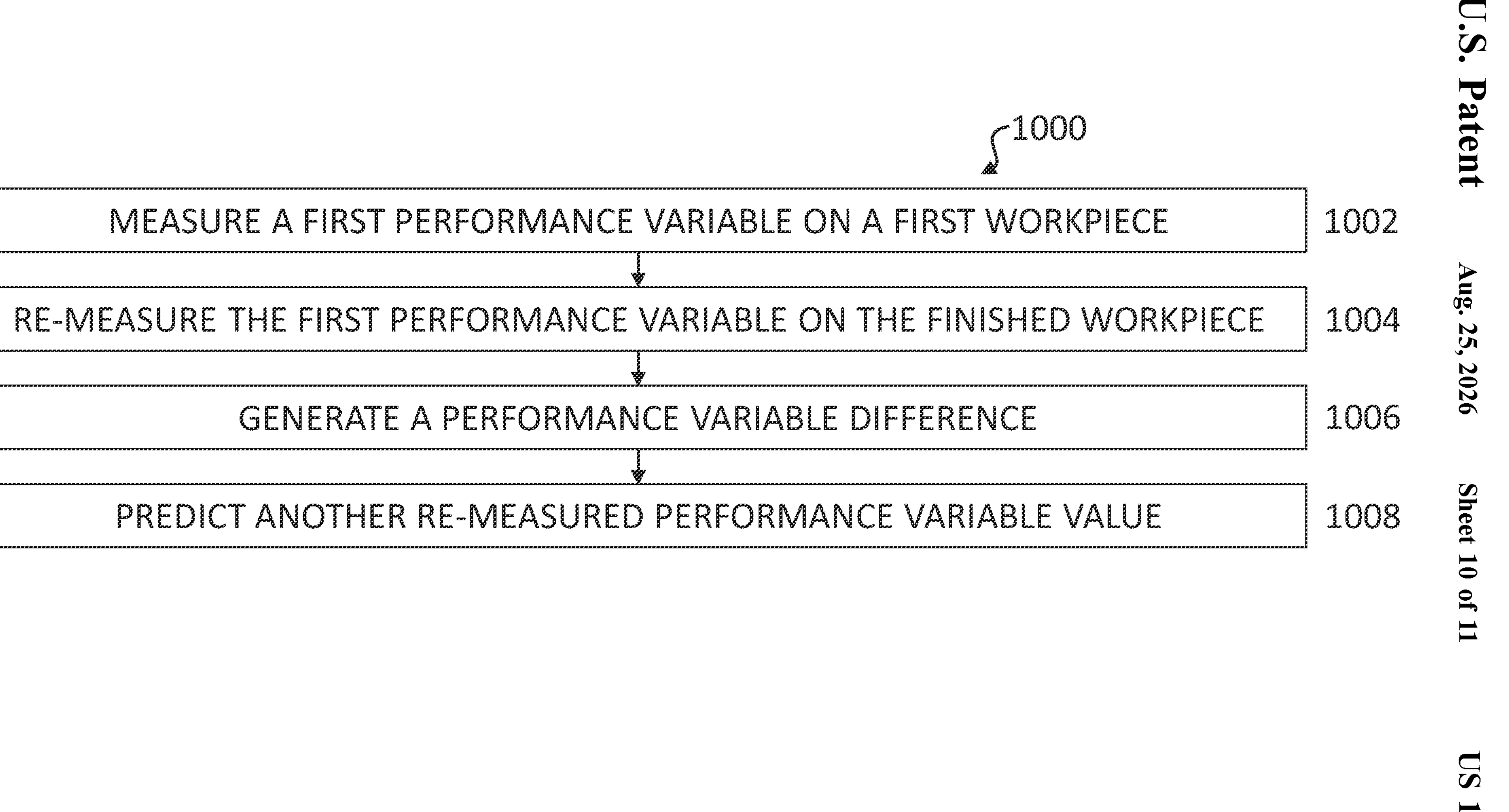
FIG. 10 illustrates an example flow diagram for predicting a performance variable difference during manufacturing in accordance with one or more embodiments of the presently disclosed technology.

FIG. 10 illustrates an example flow diagram 1000 for predicting a performance variable difference during manufacturing in accordance with one or more embodiments of the present disclosure. 1002 may include measuring a first performance variable on a first workpiece of a golf club head. The first workpiece may include a first portion and a second portion. The first workpiece may be formed by casting a component of the golf club head and polishing and/or otherwise finishing the first workpiece to the intended performance variable values and intended golf club head specification values. The measured performance variable value of the first workpiece may be recorded or otherwise stored in electronic storage. 1002 may be performed by a physical computer processor configured by machine-readable instructions including a component that is the same as or similar to measuring component 610, in accordance with one or more embodiments. For example, this may include measuring a CT center using a CT test device. In embodiments, 1002 may be fully or partially performed by hand or without computer and/or automated aid.

In some embodiments, method 1000 may include measuring a golf club head specification of the first workpiece. The measured golf club head specification value of the first workpiece may be recorded or otherwise stored in electronic storage. This operation may be performed by a physical computer processor configured by machine-readable instructions including a component that is the same as or similar to measuring component 610, in accordance with one or more embodiments. For example, this may include measuring a face thickness TF using a micrometer. In some embodiments, this may also include measuring a total club weight. In embodiments, this operation may be fully or partially performed by hand or without computer and/or automated aid.

1004 may include re-measuring the first performance variable on the finished workpiece. The re-measured performance variable value of the finished workpiece may be recorded or otherwise stored. The finished workpiece may be formed by at least forming a second workpiece. The second workpiece may be formed by at least removing the second portion along a boundary of the first workpiece. The finished workpiece may be formed by at least forming a finished workpiece. The finished workpiece may be formed from the second workpiece. This may include coupling a supplemental portion to the first portion along the boundary. 1004 may be performed by a physical computer processor configured by machine-readable instructions including a component that is the same as or similar to measuring component 610, in accordance with one or more embodiments. For example, this may include measuring a CT center using a CT test device. In embodiments, 1004 may be fully or partially performed by hand or without computer and/or automated aid.

In some embodiments, method 1000 may include re-measuring the golf club head specification of the finished workpiece. The measured golf club head specification value of the finished workpiece may be recorded or otherwise stored in electronic storage. This operation may be performed by a physical computer processor configured by machine-readable instructions including a component that is the same as or similar to measuring component 610, in accordance with one or more embodiments. For example, this may include measuring a face thickness TF using a micrometer. In some embodiments, this may also include measuring a total club weight. In embodiments, this operation may be fully or partially performed by hand or without computer and/or automated aid.

1006 may include generating a performance variable value difference. The performance variable value difference may be a difference between a re-measured performance variable value of the completed golf club head and a measured performance variable value of the partially formed golf club head. The performance variable value difference may be recorded or otherwise stored. 1006 may be performed by a physical computer processor configured by machine-readable instructions including a component that is the same as or similar to performance variable and golf club head specification component 612, in accordance with one or more embodiments. In embodiments, 1006 may be fully or partially performed by hand or without computer and/or automated aid.

In some embodiments, method 1000 may include generating a golf club head specification value difference. The golf club head specification value difference may be a difference between a re-measured golf club head specification value of the finished workpiece and a measured golf club head specification value of the first workpiece. The golf club head specification value difference may be recorded or otherwise stored in electronic storage. This operation may be performed by a physical computer processor configured by machine-readable instructions including a component that is the same as or similar to performance variable and golf club head specification component 612, in accordance with one or more embodiments. In embodiments, this operation may be fully or partially performed by hand or without computer and/or automated aid.

1008 may include predicting another re-measured performance variable value of another finished workpiece by using the performance variable value difference on another first workpiece. A new performance variable value for a new first workpiece may be generated, provided, and/or determined. By applying the performance variable value difference to a new performance variable value of the new first workpiece, a new re-measured performance variable value of a new finished workpiece corresponding to the new first workpiece may be predicted. The predicted golf club head specification value of the new finished workpiece may be recorded or otherwise stored in electronic storage. 1008 may be performed by a physical computer processor configured by machine-readable instructions including a component that is the same as or similar to prediction component 614, in accordance with one or more embodiments. In embodiments, 1008 may be fully or partially performed by hand or without computer and/or automated aid.

Figure 11:
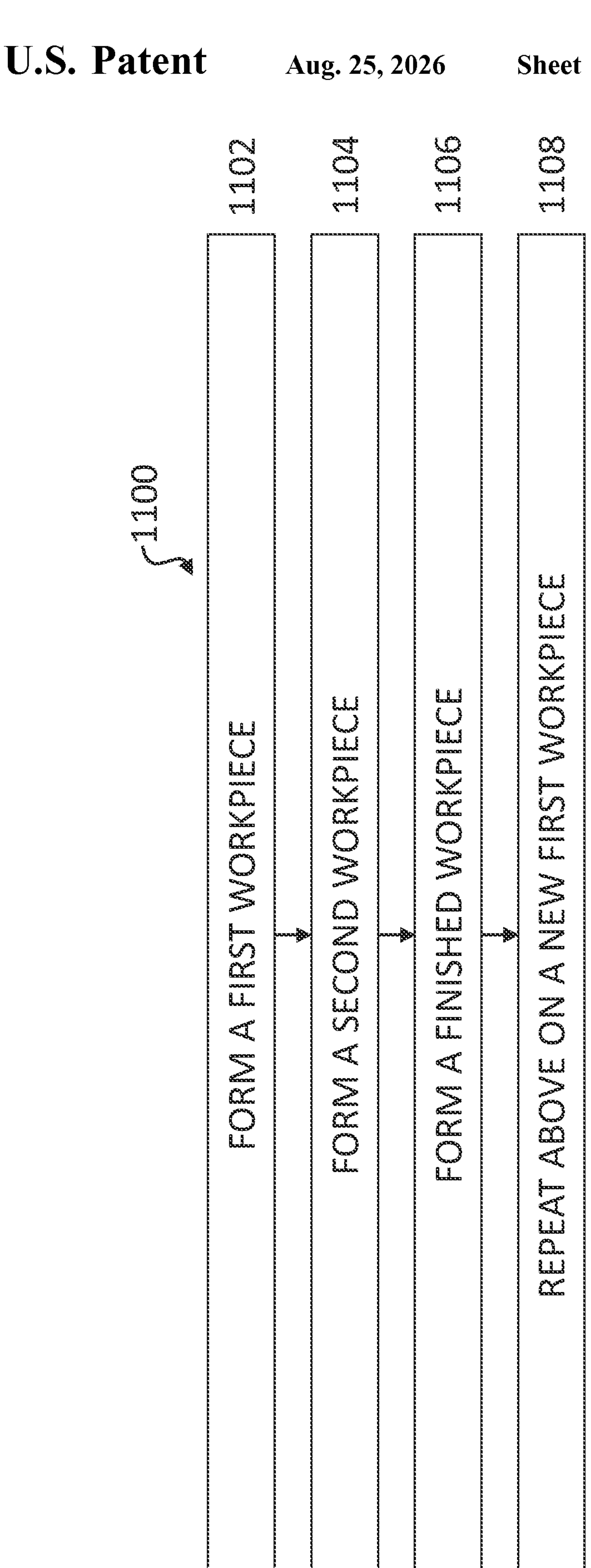
FIG. 11 illustrates an example flow diagram for manufacturing a completed golf club head in accordance with one or more embodiments of the presently disclosed technology.

FIG. 11 illustrates an example flow diagram 1100 for manufacturing a completed golf club head in accordance with one or more embodiments of the present disclosure. 1102 may include forming a first workpiece. The first workpiece may include a first portion and a second portion. The first workpiece may include a first performance variable value. The first workpiece may be formed by casting a component of the golf club head and polishing and/or otherwise finishing the first workpiece to the intended performance variable values and intended golf club head specification values. For example, this may include measuring a CT center using a CT test device. The first performance variable value of the first workpiece may be recorded or otherwise stored in electronic storage. In some embodiments, the first workpiece may include a first golf club head specification value. For example, this may include measuring a face thickness TF using a micrometer. In some embodiments, this may also include measuring a total club weight. The first golf club head specification value of the first workpiece may be recorded or otherwise stored in electronic storage. 1102 may be performed by a physical computer processor configured by machine-readable instructions including a component that is the same as or similar to forming component 608 and/or measuring component 610, in accordance with one or more embodiments. In embodiments, 1102 may be fully or partially performed by hand or without computer and/or automated aid.

1104 may include forming a second workpiece. The second workpiece may be formed by at least removing the second portion along a boundary of the first workpiece. 1104 may be performed by a physical computer processor configured by machine-readable instructions including a component that is the same as or similar to forming component 608, in accordance with one or more embodiments. This may include a physical computer processor developed to cast, forge, weld, bond, mold, remove, or otherwise form the golf club head. For example, this may include using a CNC device, as discussed herein. In embodiments, 1104 may be fully or partially performed by hand or without computer and/or automated aid.

1106 may include forming a finished workpiece. The finished workpiece may be formed from the second workpiece. This may include coupling a supplemental portion to the first portion along the boundary. The finished workpiece may include a second performance variable value. For example, this may include measuring a CT center using a CT test device. The second performance variable value of the finished workpiece may be recorded or otherwise stored. In some embodiments, the finished workpiece may include a second golf club head specification value. For example, this may include measuring a face thickness TF using a micrometer. In some embodiments, this may also include measuring a total club weight. The second golf club head specification value of the finished workpiece may be recorded or otherwise stored in electronic storage. 1106 may be performed by a physical computer processor configured by machine-readable instructions including a component that is the same as or similar to forming component 608 and/or measuring component 610, in accordance with one or more embodiments. This may include a physical computer processor developed to cast, forge, weld, bond, mold, remove, or otherwise form the golf club head. For example, this may include using a CNC device, as discussed herein. In embodiments, 1106 may be fully or partially performed by hand or without computer and/or automated aid.

1108 may include repeating operations 1102, 1104, and 1106 on a new first workpiece to form a new finished workpiece. The new finished workpiece may include a predicted performance variable value and a fourth performance variable value. The predicted performance variable value may be predicted by applying a performance variable value difference to a third performance variable value corresponding to the new first workpiece. The predicted performance variable value may be the same value, or about the same value, as the fourth performance variable value. 1108 may be performed by a physical computer processor configured by machine-readable instructions including a component that is the same as or similar to forming component 608 and/or measuring component 610, in accordance with one or more embodiments. This may include a physical computer processor developed to cast, forge, weld, bond, mold, remove, or otherwise form the golf club head. For example, this may include using a CNC device, as discussed herein. In embodiments, 1108 may be fully or partially performed by hand or without computer and/or automated aid.

As used herein, the term component might describe a given unit of functionality that can be performed in accordance with one or more embodiments of the technology disclosed herein. As used herein, a component might be implemented utilizing any form of hardware, software, or a combination thereof. For example, a processor, controller, ASIC, PLA, PAL, CPLD, FPGA, logical component, software routine or other mechanism might be implemented to make up a component. In embodiments, the various components described herein might be implemented as discrete components or the functions and features described can be shared in part or in total among components. In other words, as would be apparent to one of ordinary skill in the art after reading this description, the various features and functionality described herein may be implemented in any given application and can be implemented in separate or shared components in various combinations and permutations. Even though various features or elements of functionality may be individually described or claimed as separate components, one of ordinary skill in the art will understand that these features and functionality can be shared among common software and hardware elements, and such description shall not require or imply that separate hardware or software components are used to implement such features or functionality.

Where components of the technology are implemented in whole or in part using software, in one or more embodiments, these software elements can be implemented to operate with a computing or processing component capable of carrying out the functionality described with respect thereto.

The various embodiments set forth herein may be described in terms of exemplary block diagrams, flow charts, and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

Other than in at least some of the operating examples, or unless otherwise expressly specified, all of the numerical ranges, amounts, values and percentages such as those for amounts of materials, moment of inertias, center of gravity locations, loft, angles, various ratios, and others in the aforementioned portions of the specification may be read as if prefaced by the word “about” even though the term “about” may not expressly appear in the value, amount, or range. Accordingly, unless indicated to the contrary, the numerical parameters set forth in the above specification and appended claims are approximations that may vary depending upon the desired properties sought to be obtained by the presently disclosed technology. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the presently disclosed technology are approximations, the numerical values set forth in the specific examples are reported as precisely as possible. Any numerical value, however, inherently contains certain errors necessarily resulting from the standard deviation found in their respective testing measurements. Furthermore, when numerical ranges of varying scope are set forth herein, it is contemplated that any combination of these values inclusive of the recited values may be used.

While various embodiments of the disclosed technology have been described above, it should be appreciated these are examples only, and not limiting. Likewise, the various figures may depict an example configuration or structure to aid in understanding the features and functionality that can be included in the disclosed technology. The presently disclosed technology is not intended to be restricted to the illustrated example configurations and structures, and the desired features can be implemented with a variety of alternative configurations and structures. It may be apparent to one of skill in the art how alternative embodiments can be implemented to impart the desired features of the presently disclosed technology. Therefore, it will be understood that the appended claims are intended to cover all such modifications and embodiments, which would come within the spirit and scope of the presently disclosed technology.

While the presently disclosed technology may be described herein in terms of various exemplary embodiments, it should be understood that the various features described in any individual embodiment is not limited to its particular embodiment, and can be applied, whether alone or in combinations with features of other embodiments, to another embodiment, whether or not such an embodiment is described herein or described as part of a single embodiment. Thus, the breadth and scope of the presently disclosed technology should not be limited to any of the above-described exemplary embodiments.

Words, phrases, and their variations that are used herein, unless otherwise expressly stated, should be construed as open ended, not as limiting. For example, the term "include" should be read to mean "include, without limitation"; the term "example" should be read to mean the following provides exemplary instances, not an exhaustive or limiting list thereof; "a" or "an" should be read as meaning "at least one," "one or more" etc.; and "traditional," "normal," and similar terms should not be construed as limiting to a given time period, but should be read to encompass traditional, normal, like technologies that may be known now or at any future point. In addition, references herein to technologies that would be apparent or known to one of ordinary skill in the art includes such technologies that are apparent or known to one of ordinary skill in the art now or at any time in the future.

The presence of words and phrases such as "one or more," "at least," "not limited to," or other similar phrases shall not be read to necessarily mean that the narrower case is intended in instances where such broadening phrases may be absent. The presence of words such as "first," "second," or other similar words shall not be read to mean that there can only be one or two elements.

What is claimed is:

1. A method of predicting a performance variable difference during manufacturing, comprising:
partially forming a golf club head of a first material;
measuring a performance variable of the partially formed golf club head;
removing a portion of the partially formed golf club head creating a void;
completing a formation of the golf club head by at least filling the void with a second material; and
re-measuring the performance variable of the completed golf club head.

2. The method of claim 1, further comprising generating a performance variable value difference, wherein the performance variable value difference is a difference between a re-measured performance variable value of the completed golf club head and a measured performance variable value of the partially formed golf club head.

3. The method of claim 2, further comprising predicting another performance variable value of another completed golf club head by using the performance variable value difference on another partially formed golf club head.

4. The method of claim 2, wherein the performance variable value difference is zero.

5. The method of claim 1, wherein the performance variable is one of a characteristic time, a coefficient of restitution, and a resilience.

6. The method of claim 1, wherein the first material is a metal, and the second material is a composite.

7. A method of predicting a performance variable value difference during manufacturing, comprising:
measuring a first performance variable on a first workpiece of a golf club head, wherein the first workpiece comprises a first portion and a second portion;
forming a second workpiece by removing the second portion along a boundary of the first workpiece;
forming a finished workpiece from the second workpiece by at least coupling a supplemental portion to the first portion along the boundary; and
re-measuring the first performance variable on the finished workpiece.

8. The method of claim 7, further comprising generating a performance variable value difference, wherein the performance variable value difference is a difference between a re-measured performance variable value of the finished workpiece and a measured performance variable value of the first workpiece.

9. The method of claim 8, further comprising predicting another performance variable value of another finished workpiece by using the performance variable value difference on another first workpiece.

10. The method of claim 7, wherein the first performance variable is one of a characteristic time, a coefficient of restitution, and a resilience.

11. The method of claim 7, wherein the first portion comprises a first material, wherein the first material is a metal, wherein the supplemental portion comprises a second material, and wherein the second material is a composite.

12. The method of claim 7, wherein the second portion is removable.

13. The method of claim 7, wherein the first portion is a frontal portion of the golf club head, and the second portion is a rear portion of the golf club head.

14. A method of manufacturing a completed golf club head, comprising:
forming a first workpiece comprising a first portion and a second portion, wherein the first workpiece comprises a first performance variable value;
forming a second workpiece by removing the second portion along a boundary of the first workpiece; and
finishing the second workpiece into a finished workpiece by at least coupling a supplemental portion to the first portion along the boundary, wherein the finished workpiece comprises a second performance variable value.

15. The method of claim 14, wherein a difference between the second performance variable value and the first performance variable value is a performance variable value difference.

16. The method of claim 14, wherein the first performance variable value and the second performance variable value are values of one of a characteristic time, a coefficient of restitution, and a resilience.

17. The method of claim 14, wherein the finished workpiece comprises multiple, different materials.

18. The method of claim 14, wherein the first portion is a frontal portion of the first workpiece, and the second portion is a rear portion of the first workpiece.

19. A system for predicting a performance variable value difference during manufacturing comprising:

electronic storage; and a physical computer processor configured by machine readable instructions to:

measure, with the physical computer processor, a performance variable of a partially formed golf club head, wherein the partially formed golf club head is formed from a first material;

re-measure, with the physical computer processor, the performance variable of a completed golf club head, wherein the completed golf club head is formed by at least removing a portion of the partially formed golf club head creating a void and filling the void with a second material;

generate, with the physical computer processor, a performance variable value difference, wherein the performance variable value difference is a difference between a re-measured performance variable value of the completed golf club head and a measured performance variable value of the partially formed golf club head; and store, in the electronic storage, the performance variable value difference.

20. The system of claim 19, wherein the physical computer processor is further configured by machine readable instructions to predict, with the physical computer processor, another performance variable value of another completed golf club head by using the performance variable value difference on another partially formed golf club head.

21. A system for predicting a performance variable value difference during manufacturing comprising a physical computer processor configured by machine readable instructions to:

use a measuring component configured to measure a performance variable of the partially formed golf club head, wherein the partially formed golf club head is formed from a first material;

use the measuring component configured to re-measure the performance variable of a completed golf club head, wherein the completed golf club head is formed by at least removing a portion of the partially formed golf club head creating a void and filling the void with a second material;

use a performance variable and golf club head specification component configured to generate a performance variable value difference, wherein the performance variable value difference is a difference between a re-measured performance variable value of the completed golf club head and a measured performance variable value of the partially formed golf club head; and use a prediction component configured to predict another performance variable value of another completed golf club head by using the performance variable value difference on another partially formed golf club head.

* * * * *